(12) United States Patent
Wosik et al.

(10) Patent No.: US 7,859,264 B2
(45) Date of Patent: Dec. 28, 2010

(54) SUPERCONDUCTING LOOP, SADDLE AND BIRDCAGE MRI COILS CAPABLE OF SIMULTANEOUSLY IMAGING SMALL NONHUMAN ANIMALS

(75) Inventors: Jaroslaw Wosik, Houston, TX (US); Krzysztof Nesteruk, Warswa (PL); Lei Ming P Xie, Houston, TX (US)

(73) Assignee: The University of Houston, Houston, TX (US)

( * ) Notice: Subject to any disclaimer, the term of this patent is extended or adjusted under 35 U.S.C. 154(b) by 351 days.

(21) Appl. No.: 10/583,625

(22) PCT Filed: Jan. 20, 2005

(86) PCT No.: PCT/US2005/001813

§ 371 (c)(1),
(2), (4) Date: Jul. 11, 2008

(87) PCT Pub. No.: WO2005/078468

PCT Pub. Date: Aug. 25, 2005

(65) Prior Publication Data

US 2008/0278166 A1    Nov. 13, 2008

Related U.S. Application Data

(60) Provisional application No. 60/537,782, filed on Jan. 20, 2004.

(51) Int. Cl.
*G01V 3/00* (2006.01)
*A61B 5/055* (2006.01)

(52) U.S. Cl. ..................... 324/318; 324/321; 600/410; 600/422

(58) Field of Classification Search ......... 324/300–322; 600/407–435; 427/63; 382/128–131
See application file for complete search history.

(56) References Cited

U.S. PATENT DOCUMENTS 5,466,480 A * 11/1995 Zhou et al. ................ 427/63
5,565,778 A   10/1996 Brey et al.
5,585,723 A   12/1996 Withers et al.

(Continued)

FOREIGN PATENT DOCUMENTS

DE    42 18 635    12/1993

(Continued)

OTHER PUBLICATIONS

Wosik et al., Jul. 10, 2003, A Novel planar design of 200 MHz superconducting array.

(Continued)

*Primary Examiner*—Brij B. Shrivastav
*Assistant Examiner*—Tiffany A Fetzner
(74) *Attorney, Agent, or Firm*—Robert W. Strozier

(57) ABSTRACT

New MRI coil and resonators are disclosed based solely on superconducting inductive element and built-in capacitive elements as well as hybrid superconducting-metal inductive and capacitive elements having superior SNR. Single and multiple small animal MRI imaging units are also disclosed including one or more resonators of this invention surrounding one or more small animal cavities. Methods for making and using the MRI coils and/or arrays are also disclosed.

32 Claims, 25 Drawing Sheets

U.S. PATENT DOCUMENTS

| | | | |
|---|---|---|---|
| 5,619,996 A * | 4/1997 | Beresten | 600/422 |
| 6,087,832 A * | 7/2000 | Doty | 324/318 |
| 6,285,189 B1 * | 9/2001 | Wong | 324/318 |
| 6,377,047 B1 * | 4/2002 | Wong et al. | 324/318 |
| 6,556,013 B2 * | 4/2003 | Withers | 324/322 |
| 6,590,394 B2 * | 7/2003 | Wong et al. | 324/318 |
| 6,657,433 B1 * | 12/2003 | Locatelli et al. | 324/318 |
| 6,727,700 B2 * | 4/2004 | Marek | 324/318 |
| 6,842,004 B2 * | 1/2005 | Withers et al. | 324/318 |
| 6,930,482 B2 * | 8/2005 | Heid et al. | 324/318 |
| 6,950,063 B2 | 9/2005 | Nesteruk et al. | |
| 6,958,608 B2 * | 10/2005 | Takagi et al. | 324/318 |
| 7,295,009 B2 * | 11/2007 | Withers | 324/318 |
| 7,408,351 B2 * | 8/2008 | Yoshida | 324/318 |
| 7,511,497 B2 * | 3/2009 | Wosik et al. | 324/318 |
| 7,619,412 B2 * | 11/2009 | Okamoto et al. | 324/318 |
| 2002/0067167 A1 | 6/2002 | Romo et al. | |
| 2002/0190715 A1 * | 12/2002 | Marek | 324/318 |
| 2003/0052682 A1 * | 3/2003 | Withers | 324/322 |
| 2003/0062896 A1 * | 4/2003 | Wong et al. | 324/318 |
| 2004/0032262 A1 * | 2/2004 | Withers et al. | 324/318 |
| 2004/0239327 A1 * | 12/2004 | Heid et al. | 324/318 |
| 2004/0251902 A1 * | 12/2004 | Takagi et al. | 324/318 |
| 2005/0200359 A1 * | 9/2005 | Withers | 324/318 |
| 2005/0275403 A1 * | 12/2005 | Pinkerton et al. | 324/318 |
| 2007/0013377 A1 * | 1/2007 | Wosik et al. | 324/322 |
| 2008/0278166 A1 * | 11/2008 | Wosik et al. | 324/318 |
| 2009/0079432 A1 * | 3/2009 | Pinkerton et al. | 324/322 |

FOREIGN PATENT DOCUMENTS

| | | |
|---|---|---|
| EP | 0 895 092 | 2/1999 |
| EP | 1 251 361 | 10/2002 |
| FR | 2 616 911 | 12/1988 |
| WO | WO93/24848 | 12/1993 |
| WO | WO00/70356 | 11/2000 |

OTHER PUBLICATIONS

Chow et al, Jul. 10, 2003, A two-channel HTS thin-film phased array coil for low field MRI.

Malagoli et al, Oct. 2002, Radiofrequency response of Ag-sheilded . . . superconducting tapes.

* cited by examiner

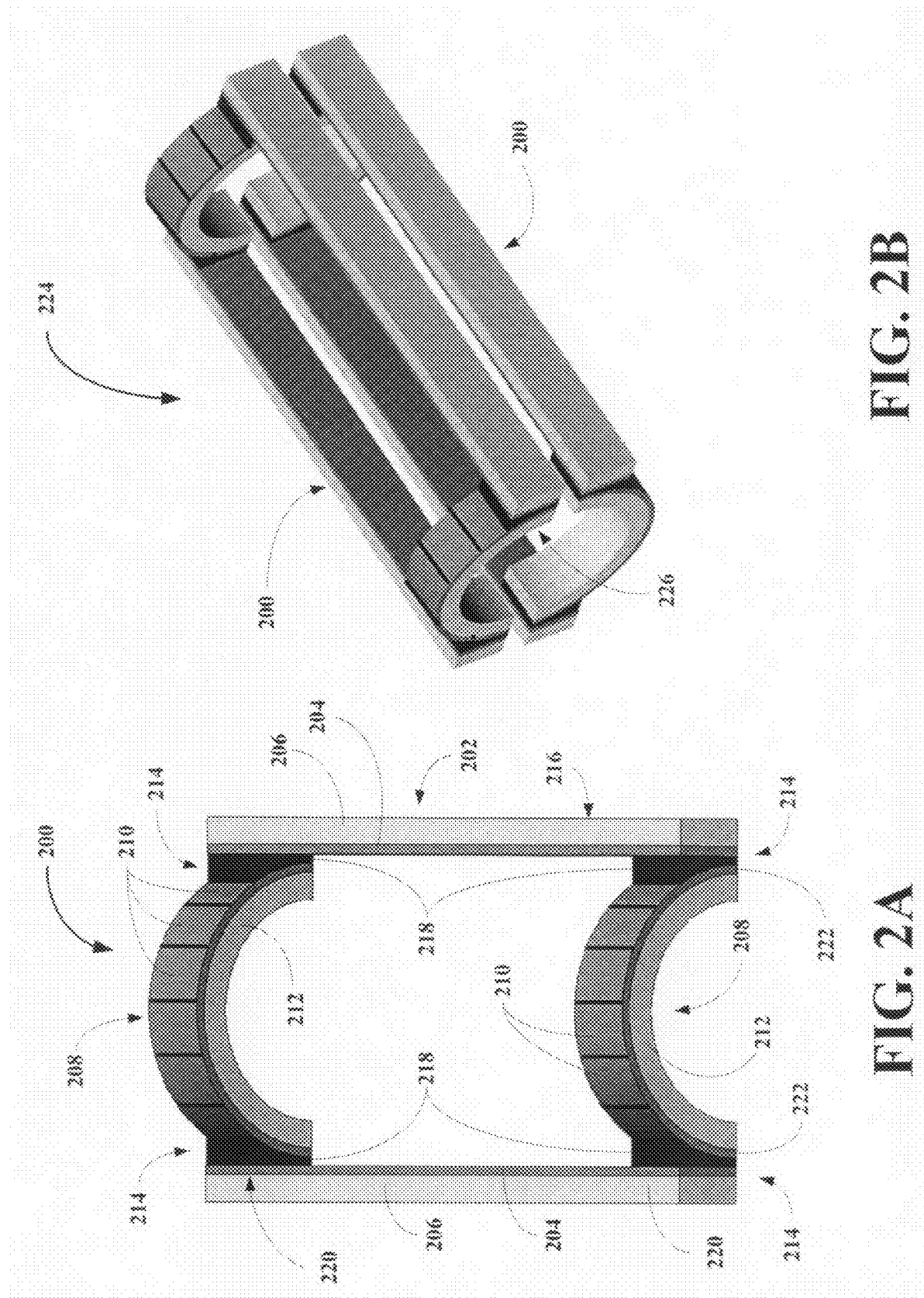

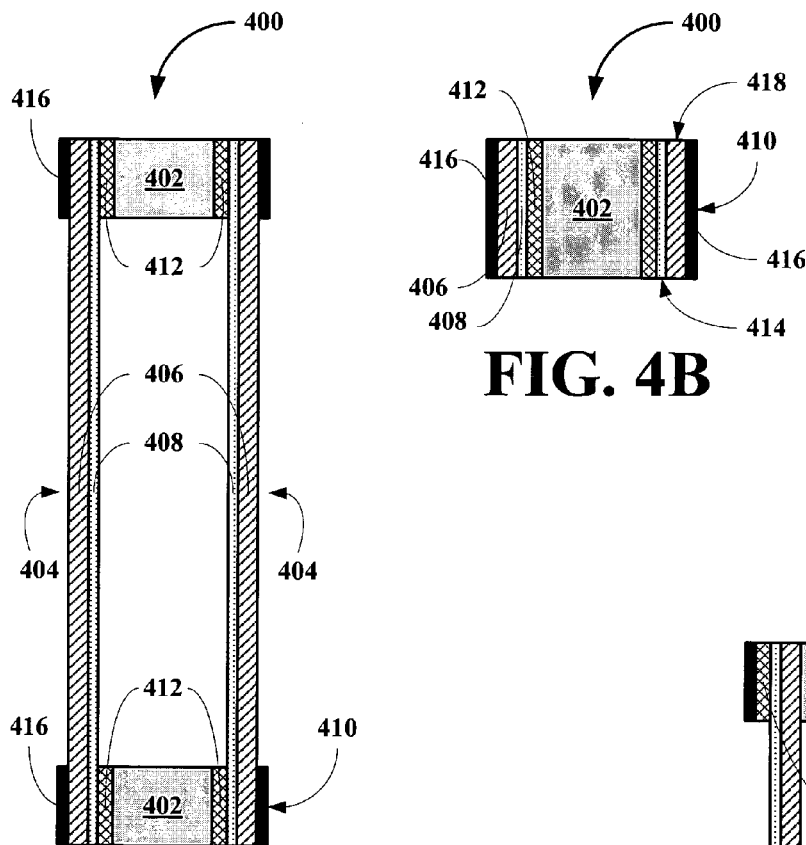
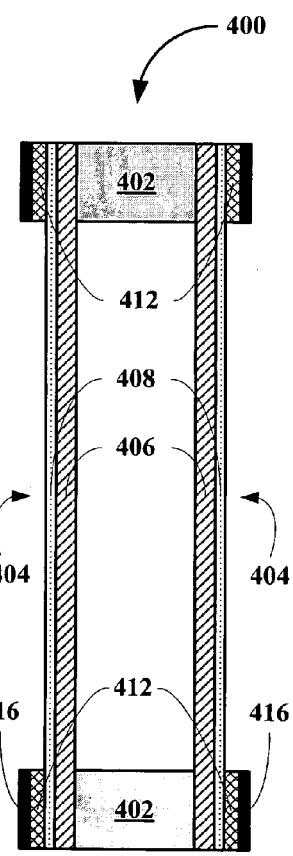
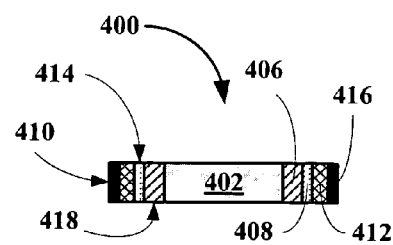
FIG. 4A    FIG. 4B    FIG. 4C    FIG. 4D

C – Coil Capacitor
L – Coil Inductance
CC – Coupling Capacitor
DC – De-coupling Capacitor
CM – Matching Capacitor
O/P – OUTPUT TO PRE-AMP

IV. ADDITIONAL INFORMATION
SNR for Two Saddle Coils in Horizontal Position

SUPERCONDUCTING LOOP, SADDLE AND BIRDCAGE MRI COILS CAPABLE OF SIMULTANEOUSLY IMAGING SMALL NONHUMAN ANIMALS

RELATED APPLICATIONS

The present application is the U.S. Nationalization of PCT/US2005/001813 filed Jan. 20, 2005, which claims provisional priority to U.S. Provisional Patent Application Ser. No. 60/537,782 filed Jan. 20, 2004, the entire contents of which are hereby incorporated by reference.

BACKGROUND OF THE INVENTION

1. Field of the Invention

The present invention relates to the general field of magnetic resonance, and to methods and apparatus for their practice.

More particularly, the present invention relates to an apparatus and a method for using the apparatus, where the apparatus includes a housing including at least one cavity for housing a small mammal, where the housing includes a superconducting array of MRI elements cooled by liquid nitrogen and where the housing with an animal therein is designed to place in an MRI instrument and MRI images of the mammal obtained.

2. Description of the Related Art

It is known that in magnetic resonance imaging (MRI) when receiving signal coil noise dominates, overall system noise, using superconducting receiving coil, increases significantly as does overall signal-to-noise ratio of the MRI system. Superconducting coils in either surface coil or volume coil configuration are formed out of four or more sections of dielectric/superconductor or dielectric/metal strips. Strips are made out of thin high temperature superconducting (HTS) or metal thin films deposited on dielectric rigid or flexible substrates. Such strips are connected together via build-in capacitors. At each of the connections, YBCO layers are separated by dielectric layers to form capacitors. Resonant frequency is determined mainly by a length of the structure and a thickness of the dielectric layer separating the YBCO layers and a dielectric constant of the dielectric layer. Flat surface coils, saddle coils and volume birdcage coils have been designed.

Birdcage radio frequency coils have been widely used in magnetic resonance imaging because of their efficiency and azimuthal B1 field homogeneity and design of all superconducting birdcage for small animals has a practical potential. Thus, there is a need in the art for efficient small animal including small mammal MEI birdcage devices that have low noise and/or improved signal-to-noise ratios and have the capability of simultaneously housing multi-animals in a single device.

SUMMARY OF THE INVENTION

The present invention provides a MRI single coil including composite structures of dielectric layers and superconducting layers and/or metallic layers, where the layers are constructed to form inductive regions of the superconducting layers and/or metallic layers interconnected by capacitive regions formed by superconducting layers and/or metallic layer having a dielectric layer interposed therebetween.

The present invention provides a MRI phased array of coils of this invention constructed in such a way as to form MRI housings including a single animal tube or multiple animal tubes, each tube having one or more MRI arrays associated therewith.

The present invention also provides a multi-animal apparatus adapted for simultaneous measurements of multi-animals, where the apparatus includes a plurality of animal tubes, each tube including one or more MRI coils or coil arrays of this invention. In one preferred embodiment, each animal tube includes a birdcage-like MRI coil array. The apparatus also includes a cryogenic system for cooling the MRI coils or MRI coil arrays.

The present invention also provides an MRI resonator apparatus comprising four superconducting members, each member including a superconducting layer, where the members arranged to form a closed shape having four overlapping regions, and separating dielectric layers interposed between the superconducting layers at the overlapping regions to form built-in capacitors. Each member comprises a substrate dielectric layer upon which the superconducting layer was formed. The substrate dielectric layers can be rigid. Two of the substrate dielectric layers can be rigid and two of the substrate dielectric layers can be flexible. The members are straight. Two of the members can be straight and two of the members can be curvilinear. Two of the members can be straight and two of the members can be arcuate. The substrate dielectric layers can be the separating dielectric layers. The apparatus can further comprise a metal layer formed on an exposed portion of a dielectric layer or a external dielectric layer formed form on an exposed portion of a superconducting layer with a metal layer formed on the outer surface of the external dielectric layer to form coupling or decoupling capacitive elements. The apparatus can further comprise wires bonded to the metal layers, where the metal wires are adapted to link a plurality of the apparatus together to form arrays or to connect the apparatus to a pre-amplifier.

The present invention also provides a hybrid MRI resonator apparatus comprising two superconducting members, each member including a superconducting layer, two metal member, and separating dielectric layers, where the superconducting members and the metal members are arranged to form a closed shape having four overlapping regions and the separating dielectric layers are interposed between the superconducting layers and the metal members at the overlapping regions to form built-in capacitors. Each superconducting member comprises a substrate dielectric layer upon which the superconducting layer was formed. The substrate dielectric layers can be rigid. Two of the substrate dielectric layers can be rigid and two of the substrate dielectric layers can be flexible. The superconducting members can be straight or curvilinear or arcuate. The substrate dielectric layers can be the separating dielectric layers. The apparatus can further comprise a metal layer formed on an exposed portion of a dielectric layer or a external dielectric layer formed form on an exposed portion of a superconducting layer with a metal layer formed on the outer surface of the external dielectric layer to form coupling or decoupling capacitive elements. The apparatus can further comprise wires bonded to the metal layers, where the metal wires are adapted to link a plurality of the apparatus together to form arrays or to connect the apparatus to a pre-amplifier.

The present invention provides a birdcage-type resonator apparatus comprising a plurality of coils apparatus including four members, each member including a superconducting layer, where the members arranged to form a closed shape having four overlapping regions, and separating dielectric layers interposed between the superconducting layers at the overlapping regions to form built-in capacitors, and at least one small animal cavity, where the coil apparatus are arranged around the cavity to permit MRI imaging of an animal placed within the cavity. Each member comprises a substrate dielectric layer upon which the superconducting layer was formed. The substrate dielectric layers can be rigid. Two of the substrate dielectric layers can be rigid and two of the substrate dielectric layers can be flexible. The members can be straight. Two of the members can be straight and two of the members can be curvilinear. Two of the members can be straight and two of the members can be arcuate. The substrate dielectric layers can be the separating dielectric layers. The apparatus further comprises a metal layer formed on an exposed portion of a dielectric layer or a external dielectric layer formed form on an exposed portion of a superconducting layer with a metal layer formed on the outer surface of the external dielectric layer to form coupling or decoupling capacitive elements. The apparatus further comprises wires bonded to the metal layers, where the metal wires are adapted to link a plurality of the apparatus together to form arrays or to connect the apparatus to a pre-amplifier.

The present invention also provides a birdcage-type resonator apparatus comprising a plurality of coils apparatus including two superconducting members, each member including a superconducting layer, two metal member, and separating dielectric layers, and at least one small animal cavity, where the coil apparatus are arranged around the cavity to permit MRI imaging of an animal placed within the cavity and where the superconducting members and the metal member are arranged to form a closed shape having four overlapping regions and the separating dielectric layers are interposed between the superconducting layers and the metal members at the overlapping regions to form built-in capacitors. Each superconducting member comprises a substrate dielectric layer upon which the superconducting layer was formed. The substrate dielectric layers can be rigid. Two of the substrate dielectric layers can be rigid and two of the substrate dielectric layers can be flexible. The superconducting members can be straight. The superconducting members can be curvilinear. The superconducting members can be arcuate. The substrate dielectric layers can be the separating dielectric layers. The apparatus further comprises a metal layer formed on an exposed portion of a dielectric layer or a external dielectric layer formed form on an exposed portion of a superconducting layer with a metal layer formed on the outer surface of the external dielectric layer to form coupling or decoupling capacitive elements. The apparatus further comprises wires bonded to the metal layers, where the metal wires are adapted to link a plurality of the apparatus together to form arrays or to connect the apparatus to a pre-amplifier.

The present invention also provides a small animal MRI apparatus comprising a vacuum housing including at least one cylindrical cavity adapted to receive a small animal, a coolant reservoir including a coolant, a coolant inlet, a coolant outlet and a cold plate forming an internal end of the reservoir, a resonator of this invention surrounding each cavity or a plurality of coils of this invention positioned within the housing to permit MRI imaging of an animal in each of the cavities.

BRIEF DESCRIPTION OF THE DRAWINGS

The invention can be better understood with reference to the following detailed description together with the appended illustrative drawings in which like elements are numbered the same:

FIGS. 2A & B depict a single saddle loop or coil (A) of this invention and a tube made by placing mating saddles together (B);

FIGS. 4A & B depict a preferred embodiment of a mixed metal/superconductor MRI resonator of this invention;

FIGS. 4C & D depict another preferred embodiment of a mixed metal/superconductor MRI resonator of this invention;

DETAILED DESCRIPTION OF THE INVENTION

Figure 1A:
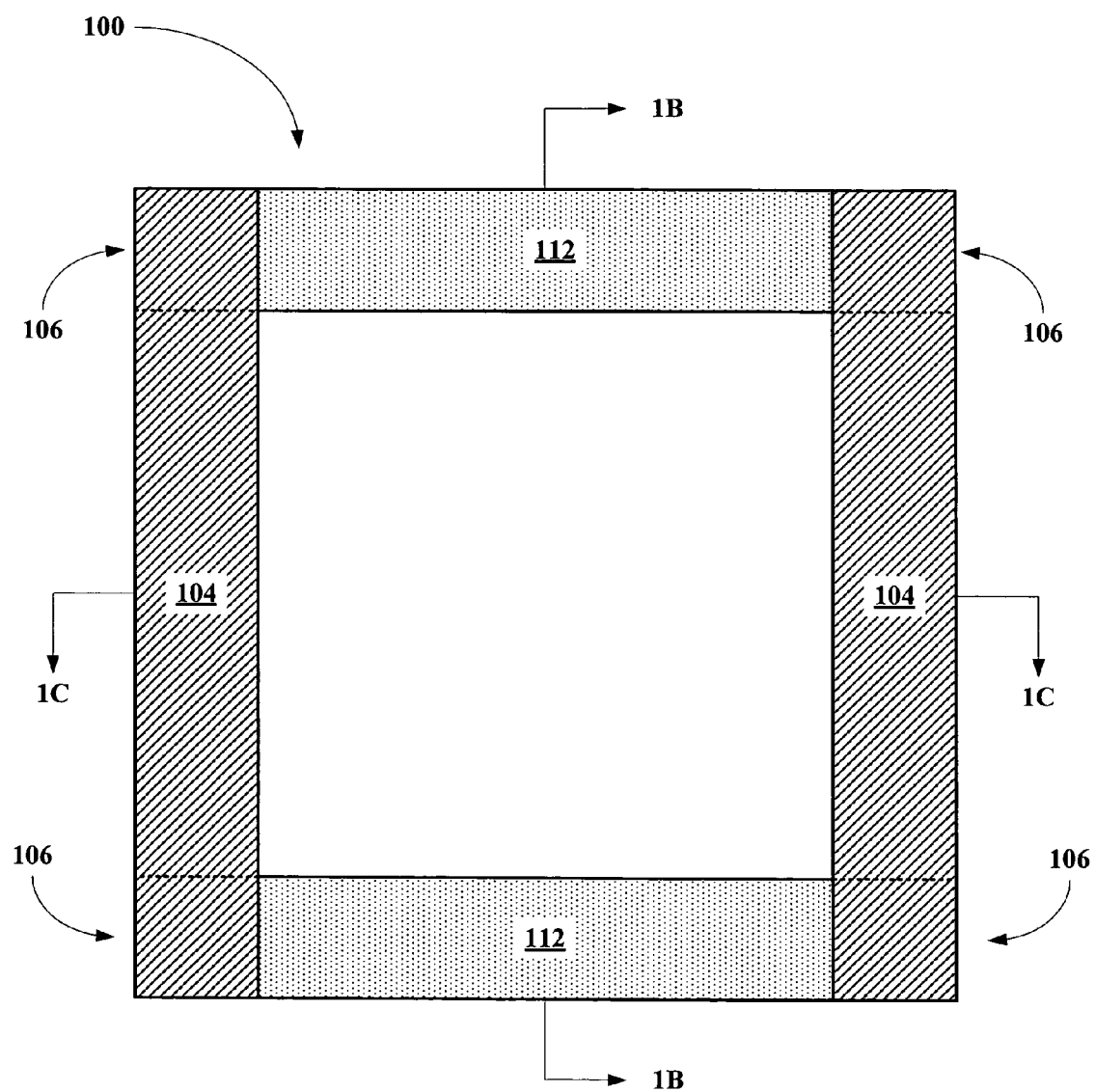
FIGS. 1A-K depict two different loop detector elements of this invention, a fabrication method, expanded views of portions of the structure showing built in capacitors and a corresponding circuit diagram.

The inventors have discovered that a new small animal or multi-small animal MRI apparatus can be designed that has an improved signal-to-noise ratio. The apparatus includes one or more small animal tubes designed to receive a small animal and at least one MRI coil or coil array associated therewith each tube. In one preferred embodiment, the coils or coil arrays are fabricated solely from superconducting materials and dielectric materials. In another preferred embodiment, the coils or coil arrays are fabricated from superconducting materials, metallic conducting materials and dielectric materials. The apparatuses also include a cryogenic cooling system. The multi-animal versions of these apparatus provide improved MRI images simultaneously for all the animals within the multiple animal apparatus.

The present invention broadly relates to an MRI coil or an array of MRI coils. Each coil includes a plurality of inductive elements, where each inductive element is formed of a superconducting layer deposited on a dielectric substrate or a metallic conducting layer or member. Each coil also includes an equal plurality of built-in capacitive elements interconnecting adjacent pairs of the inductive elements, where each capacitive element is formed from two superconducting layers with a dielectric layer interposed therebetween or a superconducting layer and a metallic conducting layer with a dielectric layer interposed therebetween. The coils can be rectangular in shape, circular in shape or elliptical in shape and can be flat, curved or curvilinear.

The present invention also broadly relates to a small animal MRI apparatus including at least one small animal cavity or tube designed to receive a small animal. Each tube includes an effective number of MRI coils or coil arrays sufficient to provide adequate MRI data about the animal or animals in the apparatus. The apparatus also includes a cryogenic cooling unit for maintaining each coil or array in a superconducting condition. The apparatus preferably includes multiple cavities, each cavity with coils or arrays so MRI data can be acquired from each animal simultaneously.

The present invention also broadly relates to method for acquiring MRI data on multiple small animals including the step of placing one or more small animals in the multiple small animal apparatus of this invention. After placing the animals in the apparatus, the small animal MRI apparatus is positioned within an MRI apparatus. The MRI coils or arrays within the apparatus are then Cooled to a superconducting state. MRI data is then collected simultaneously from each of the animals in the apparatus.

A significant improvement of the signal-to-noise ratio (SNR) for magnetic resonance imaging (MRI) applications, in which the thermal noise of the rf receiver probe dominates the system noise, can be achieved either by cooling a normal metal probe or by using superconductors. The noise in an MRI system is primarily due to thermal noise in the receiver coil and body, which is described by the Nyquist formula: $V_n = 4k(T_b R_b + T_c R_c)\Delta f$, where k is Boltzman's constant, $T_b$ and $T_c$ represent the body and coil temperatures, respectively, and $\Delta f$ is the bandwidth of the receiver.

MRI is a widely used diagnostic tool, that provides unsurpassed ability to image soft tissue. In MRI, the subject is placed in a dc magnetic field, a sequence of magnetic field gradients and rf excitation pulses are then applied to the subject, and relaxing nuclei (usually protons) produce weak decaying rf signals that are detected by an rf receiver probe. Such signals are weak due to the small differences in energy level populations of parallel and anti-parallel spins nuclei, (about 6 ppm at 1.5 T) that contribute to the signal. In both research and clinical MRI, there is a need for high resolution and/or fast scan imaging, and the signal-to-noise ratio (SNR) is the main limitation on fulfilling these requirements. This makes the overall SNR the most important parameter of MRI systems.

Noise in the system, in general, is created by conductive losses in the probe and in the body. There are two regimes of such conductive losses in MRI system. In the first regime, the loss in the body dominates, so the SNR is primarily body loss dependent. While, in the second regime, the loss in the coil dominates, so the SNR is primarily coil loss dependent. In the body-loss dependent regime, there is little advantage in reducing ohmic coil loss. However, in the coil loss dependent regime, it has long been recognized that cooling the probe reduces coil noise, and, therefore, can significantly increase the SNR of the measurements.

The discovery and development of high-temperature superconducting (HTS) materials has resulted in several attempts to build practical probes with improved SNR. Indeed, preliminary studies have shown that for selected applications, where the MRI system noise is in the coil loss regime (low-field MRI, high-field microscopy, and small-volume MRI), HTS MRI receiver coils perform significantly better than comparable copper coils. HTS thin films are very attractive for use in surface receiver coils, because such films at 77 K exhibit an extremely low surface resistance Rs (about 150 μW at 10 MHz). This low surface resistance is several orders of magnitude lower than the surface resistance of copper at the same frequency and temperature. In addition, HTS materials have relatively high critical temperature which can simplify cryostat design and affords for a short distance between the superconducting coil and the body or body part of the imaged.

One limitation when using surface probes for human imaging is their relatively small field of view. As previously mentioned, phased arrays can be used to allow small coils to cover a large region of interest, while preserving the improved SNR. Recently, the use of arrays has been complemented by elucidating optimal data combinations. For example, a set of weighting coefficients are derived, by which each pixel of each image is weighted in order to achieve an optimal combination. The limit of operation may not be defined solely by SNR, but may also have contributions from the time available for image acquisition in such techniques as functional brain imaging, real-time cardiac MRI, and pediatric MRI.

Until recently, increases in MRI acquisition speed was limited by the speed at which the field gradients could switched. However, the hardware speed has increased to the point where the main limitations are now physiological. Faster gradient switching used for imaging and/or applying more rf power per unit time cause nerve stimulation and heating, respectively. To overcome these limitations, two new techniques, known as SMASH (SiMultaneous Acquisition of Spatial Harmonics) (see D. K. Sodickson, W. J. Manning, "Simultaneous acquisition of spatial harmonics (SMASH); fast imaging with rf coils," *Magn. Reson. Med.* vol. 38, pp. 591-603, 1997) and SENSE (SENSitivity Encoding) (see K. P. Prussman, M. Weigner, M. B. Scheidegger, and P. Boesiger, "SENSE: sensitivity encoding for fast MRI," *Magn. Reson. Med.*, vol. 42, pp. 952-962, 1999), have been developed and successfully demonstrated in a number of applications. These two techniques and their variants provide faster imaging by using known arrays of receiver coils, but they also make use of the unique sensitivity profiles of elements of a receiver array in order to complement the spatial encoding generally accomplished through repeated application of phase encoding magnetic field gradients.

As the number of array elements increases and their size continues to decrease, conductive losses become more dominant. These losses can overwhelm any SNR gains expected from use of smaller coils that express less body noise. The use of cryogenically cooled copper/HTS coils can extend the depth at which SNR gains can be achieved through phased array acquisition. The potential SNR gain using large arrays increases with the number of elements: SNR gain goes up significantly when a single coil (N=1) is replaced with four coils (N=4), and it increases even more for N=8 or N=16 arrays. Thus, the potential advantage of cryogenically cooled//HTS receive arrays with a large number of elements becomes even greater. These SNR gains can be used alongside parallel imaging to achieve higher accelerations while preserving maximum available image SNR. Properly designed rf receiver coils are sensitive to rf magnetic fields, while being substantially insensitive to rf electric fields. That is why an MRI coil is always designed to form a rf resonator.

Our invention includes designs of both superconducting single coil resonators and coil array resonators and hydride single coil and coil array resonators. Superconducting coil in either surface coil or volume coil configuration is formed out of four or more sections of dielectric/superconductor or dielectric/metal strips. Strips are made out of thin HTS or metal thin films deposited on dielectric rigid or flexible substrates. Such strips are connected together via in build capacitors. At each of the connection YBCO layers and separated them dielectric layer form a capacitor. Resonant frequency is determined mainly by length of the structure and separating YBCO layers dielectric thickness and dielectric constant. Both surface flat, saddle coils and volume birdcage coils were designed. Birdcage radiofrequency coils have been widely used in magnetic resonance imaging because of their efficiency and azimuthal B1 field homogeneity and design of all superconducting birdcage for small animals has a practical potential. In the invention both single coil and phased array configurations are described. In addition, an idea for multi-animal simultaneous measurement set up is shown for both flat and birdcage-like superconducting arrays. A small cryogenic system for cooling down superconducting coils is also shown.

Suitable Materials

Suitable dielectric material for use in this invention include, without limitations, any dielectric material compatible with the superconductors or metallic conductors used to fabricate the MRI coils or coil arrays of this invention. Exemplary examples include, without limitation, $SiO_2$, $Si_3N_4$, $Al_2O_3$, $Y_2O_3$, $La_2O_3$, $Ta_2O_5$, $TiO_2$, $HfO_2$, $ZrO_2$, or the like or mixture or combinations thereof.

Suitable superconducting material for use in this invention include, without limitations, any high temperature superconducting material capable of being deposited using well known thin film deposition techniques. Preferred high temperature superconducting materials include, without limitation, high temperature superconducting materials having a $T_c$ above a temperature of liquid nitrogen or liquid carbon dioxide. One preferred class of superconducting materials include, without limitations, high temperature cuperate superconductors. Exemplary examples of cuperate superconductors include, without limitation, $YBa_2Cu_3O_7$, $La_{2-x}Ba_xCuO_4$, $La_{2-x}Sr_x$-$CuO_4$, $La_{2-x}Sr_xCaCuO_4$, $Bi_2Sr_2Ca_2Cu_3O_{10}$, $Tl_2Ba_2Ca_2Cu_3O_{10}$, $Hg_{0.8}Tl_{0.2}Ba_2Ca_2Cu_3O_{8.33}$, $HgBa_2Ca_2Cu_3O_8$, $HgBa_2Ca_3Cu_4O_{10+}$, $HgBa_2Ca_{1-x}$$Sr_xCu_2O_{6+}$, $HgBa_2CuO_4^+$, $TlBa_2Ca_2Cu_3O_{9+}$, $Tl_2Ba_2Ca_2Cu_3O_{10}$, $Tl_{1.6}Hg_{0.4}Ba_2Ca_2Cu_3O_{10+}$, $Tl_{0.5}Pb_{0.5}Sr_2Ca_2Cu_3O_9$, $Tl_2Ba_2CaCu_2O_6$, $TlBa_2Ca_3Cu_4O_{11}$, $TlBa_2CaCu_2O_{7+}$, $Tl_2Ba_2CuO_6$, $Bi_{1.6}Pb_{0.6}Sr_2Ca_2Sb_{0.1}Cu_3O_y$, $Bi_2Sr_2Ca_2Cu_3O_{10}$, $Bi_2Sr_2CaCu_2O_9$, $Bi_2Sr_2Ca_{0.8}Y_{0.2}Cu_2O_8$, $Bi_2Sr_2CaCu_2O_8$, $AuBa_2Ca_3Cu_4O_{11}$, $AuBa_2(Y, Ca)Cu_2O_7$, $AuBa_2Ca_2Cu_3O_9$, $NdBa_2Cu_3O_7$, $GdBa_2Cu_3O_7$, $YBa_2Cu_3O_7$, $Y_2Ba_4Cu_7O_{15}$, $TmBa_2Cu_3O_7$, $YbBa_2Cu_3O_7$, $Sn_2Ba_2(Y_{0.5}Sr_{0.5})Cu_3O_8$, $La_2Ba_2CaCu_5O_{9+}$, $(Sr, Ca)_5Cu_4O_{10}$, $Pb_2Sr_2(Y, Ca)Cu_3O_8$, $GaSr_2(Y, Ca)Cu_2O_7$, $(In_{0.3}Pb_{0.7})Sr_2(Ca_{0.8}Y_{0.2})Cu_2O_x$, $(La, Sr, Ca)_3Cu_2O_6$, $La_2CaCu_2O_{6+}$, $(Eu, Ce)_2(Ba, Eu)_2Cu_3O_{10+}$, $(La_{1.85}Sr_{0.15})CuO_4$, SrNdCuO, $(La, Ba)_2CuO_4$, $(Nd, Sr, Ce)_2CuO_4$, $Pb_2(Sr, La)_2Cu_2O_6$, $(La_{1.85}Ba_{0.15})CuO_4$, or the like, or mixtures or combinations thereof.

Suitable metallic material for use in this invention include, without limitations, copper, silver, gold, platinum, other noble metals, alloys thereof, or mixture or combinations thereof.

Fully Superconducting Coils

Figure 1B:
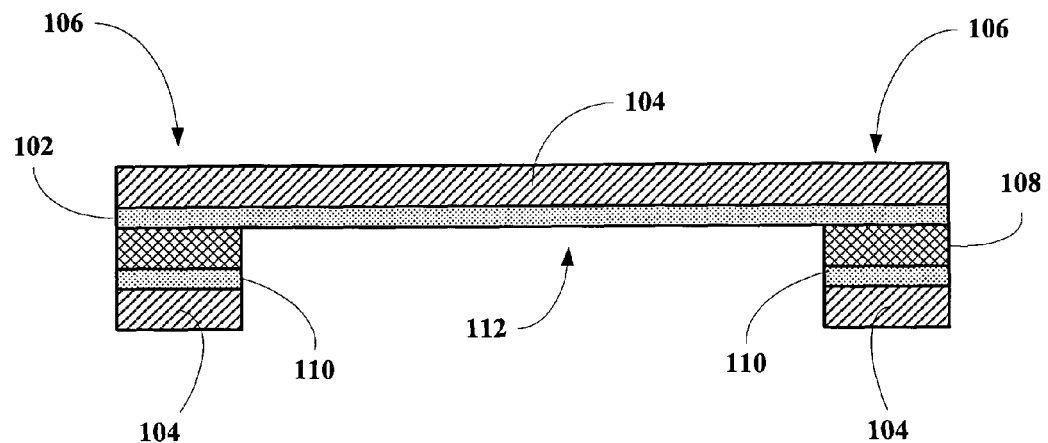
Figure 1C:
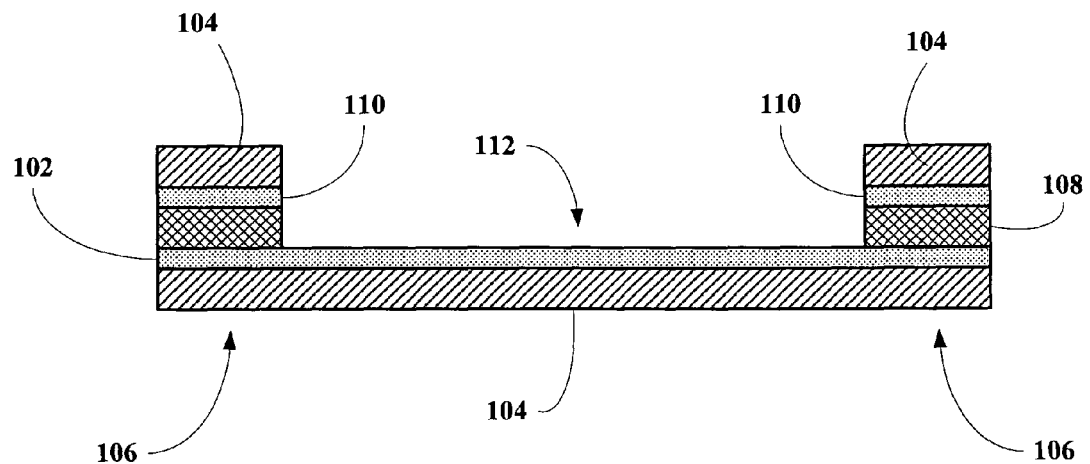

Referring now to FIGS. 1A-C, a preferred embodiment of a substantially rectangular, superconducting MRI coil or loop apparatus of this invention, generally 100, is shown to include four superconducting films 102 deposited on four dielectric strips 104. The strips 104 are arranged into the substantially rectangular coil 100 so that the superconducting films 102 face each other at overlapping end portions 106. At the end portions 106, dielectric films 108 are interposed between facing superconducting film portions 110. The overlapping end portions 106 form built in capacitors electronically interconnecting superconducting inductive portions 112 of the films 102.

Figure 1D:
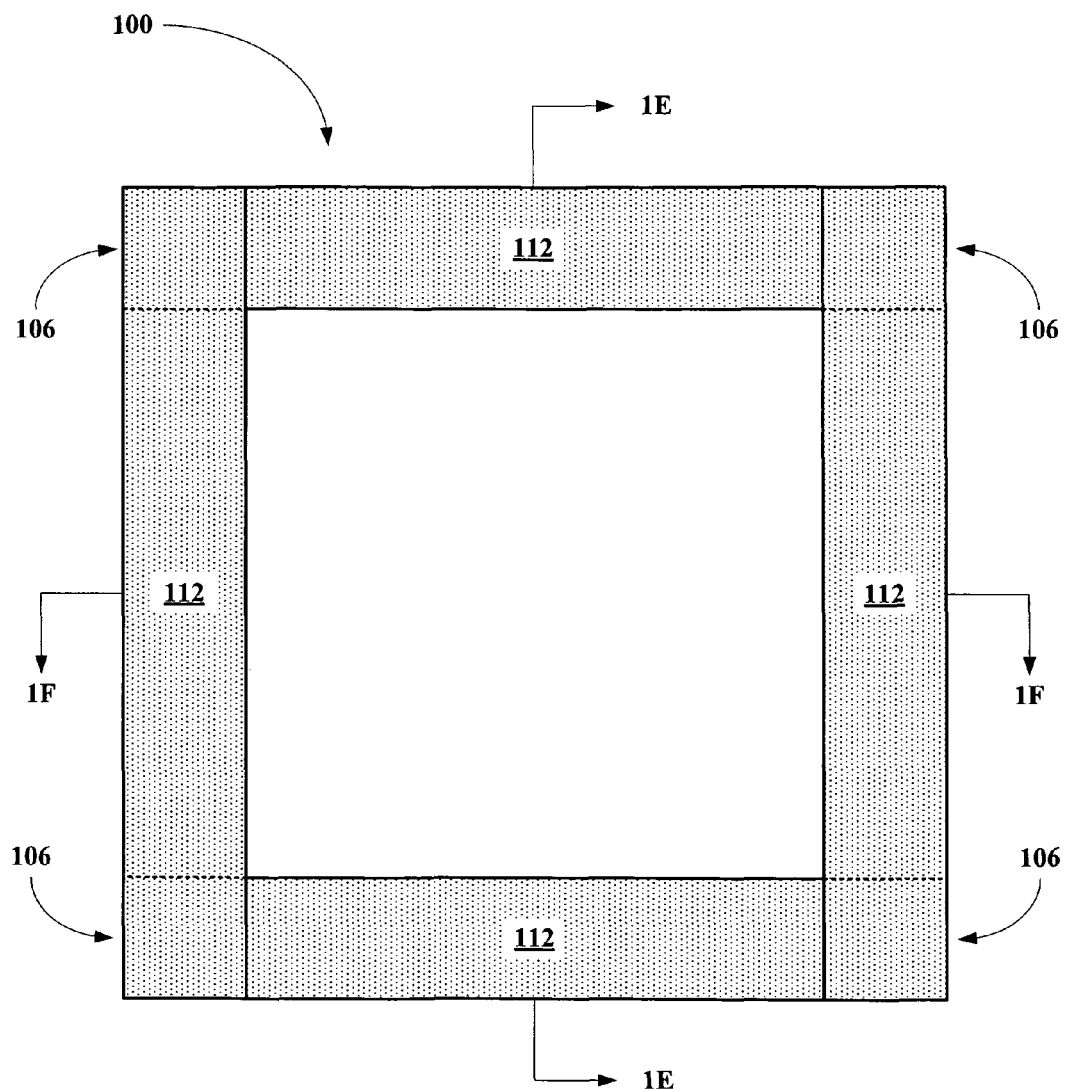
Figure 1E:
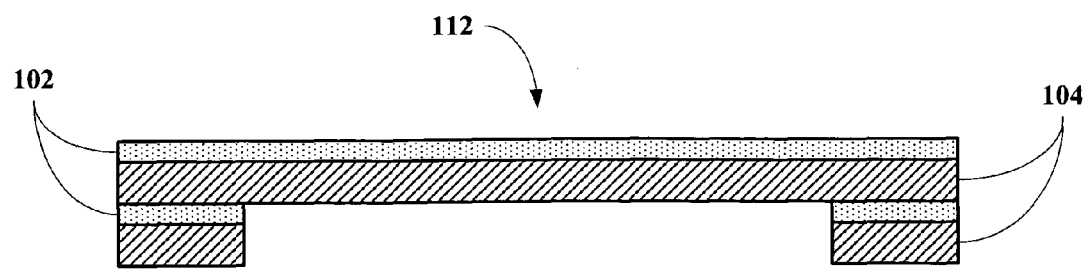
Figure 1F:
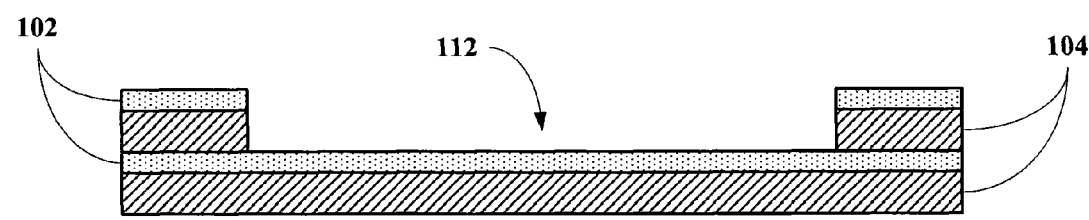

Alternatively, looking at FIGS. 1D-F, another preferred embodiment of a superconducting coil device of this invention, generally 100, is shown to include four superconducting films 102 deposited on four dielectric strips 104. The strips 104 are arranged into the substantially rectangular coil 100 so that the superconducting films 102 face up forming built in capacitors at overlapping end portions 106, which electronically interconnect superconducting inductive portions 112 of the films 102.

Figure 1G:
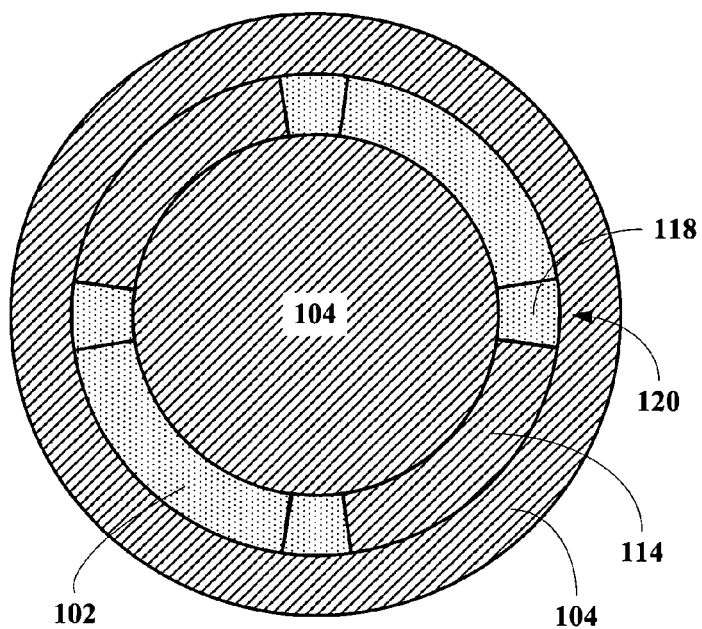
Figure 1H:
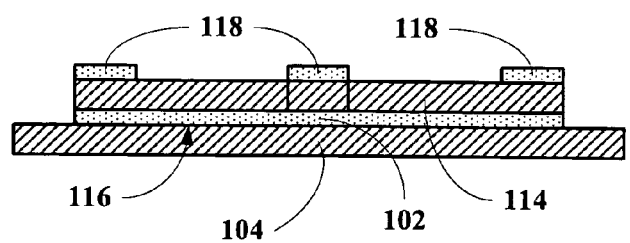

Referring now to FIGS. 1G-H, a manufacturing process for forming the loops or coils of FIG. 1A-F is shown. A superconducting film ring 102 is deposited onto a circular substrate 104. Then films of dielectric 114 are deposited on top of portions 116 of the film 102. Then small superconducting films 118 are deposited on top of the portions 120 of the dielectric films 114. The coils can be fabricated using, for example, a multi-target pulsed laser deposition technique and standard photolithography or ion milling.

One primary coil design parameter is the filling factor, which indicates how much of the coil's shape is adjusted to accommodate a shape of a body for which the coil is intended. HTS technology, in principle, requires flat epitaxially polished dielectric substrates and as a result such HTS MRI coils have different coil-body distances in the coil's center than at their edges. To overcome this deficiency, the apparatuses of the present invention are fabricated by depositing sections of HTS films on very thin flexible dielectric substrates. Such deposition is possible using an ion beam assisted deposition technique or a variant of ion beam assisted deposition.

Figure 1I:
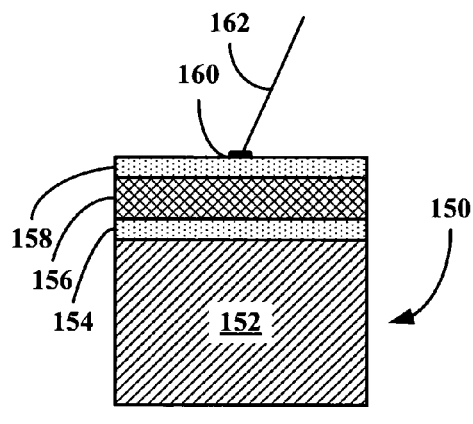
Figure 1J:
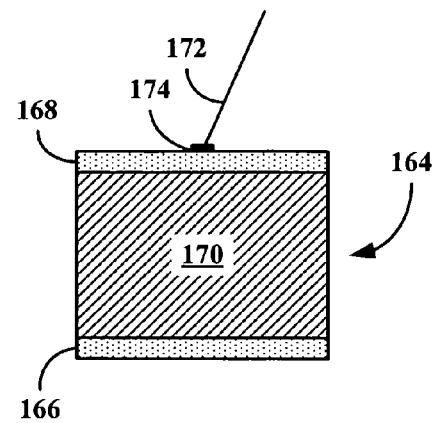

Referring now to FIGS. 1I-J, two constructions for attaching the coils of this invention to the outside world are shown. Looking at FIG. 1I, one construction 150 includes a substrate 152 having deposited thereon a first film 154 of superconducting material. Deposited on the top of the film 154 is a dielectric film 156. And deposited on the dielectric film 156 is a second film 158 of superconducting material. The construction 150 also includes a metal pad 160 having bonded thereto a wire 162 for communication with the an MRI instrument. Looking at FIG. 1J, another construction 164 includes a bottom film 166 of a superconducting material, a top film 168 of a superconducting material and a dielectric film 170 interposed therebetween. The construction 164 also includes a wire 172 bonded to the metal pad metal pad 174 deposited on the a top film 168.

Figure 1K:
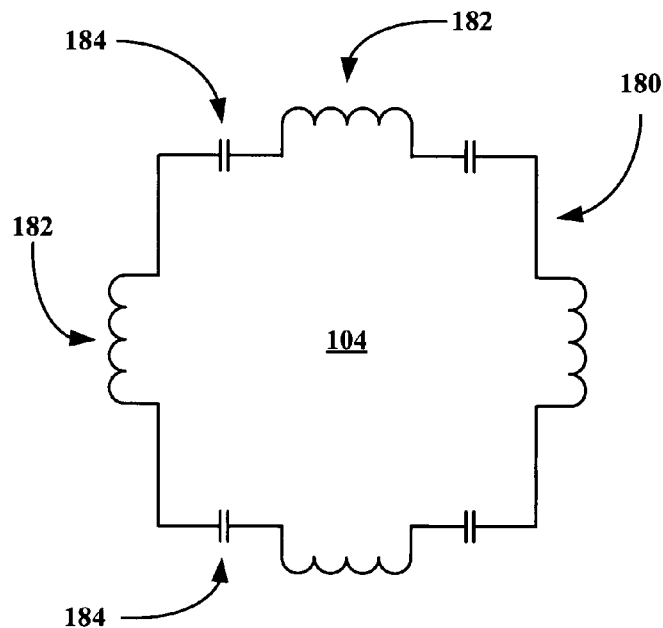

Referring now to FIG. 1K, an electrical schematic 180 is shown that is the electrical equivalent of the coils constructions of FIGS. 1A-H. The schematic 180 includes four inductors 182 interconnected by four capacitors 184. Depending on the inductance of the inductors and the capacitance of the capacitors, the coils forms a resonance circuit, which is capable of transmitting and receiving RF signals corresponding to resonances of magnetically active nuclei.

Fully Superconducting Curvilinear Coils

Referring now to FIG. 2A, a preferred embodiment of a saddle or curvilinear loop or coil of this invention, generally 200, is shown to include two straight members 202, where each straight member 202 comprises a superconductor film 204 deposited on a rigid dielectric substrate 206. The saddle coil 200 also includes two curved member 208, where each curved member 208 comprises a plurality of superconducting film sections 210 deposited on a flexible dielectric substrate 212. The saddle coil 200 also includes four capacitors 214 formed from overlapping regions 216 of the two straight members 202 and the two curved members 208. At the overlapping regions 216, dielectric films 218 are formed to separate an end portion 220 of the superconducting films 204 from end superconducting film sections 222 of the curved members 208. If the straight members 202 are flipped over, then the dielectric films 218 are not needed as was shown in FIGS. 1D-F. Of course, depending on the deposition technique used to form the superconducting films, the film could be formed without being formed of separated sections, where each section is flat and not curves.

Birdcage-Type Resonator using Curvilinear Coils

Looking at FIG. 2B, a preferred embodiment of an animal MRI or birdcage apparatus 224 is shown to include two saddle coils 200 arranged in a closed configuration forming an animal cavity 226. In such a closed configuration, the saddles 200 work either as a single coil or an array of two coils. Preferably, the superconductors are high temperature superconductors such as a YBCO superconductors. However, any other high temperature superconductor can be used as well. It should be recognized that the resonance frequency of the coils 200 are controlled by well known factors such as the dielectric used, the thickness of the superconducting and dielectric layers, the diameter of curvature to name a few and one of ordinary skill in the art can adjust these parameters to form coils having a desired shape and desired resonance frequency.

Fully Superconducting Birdcage-Type Resonators

Figure 3A:
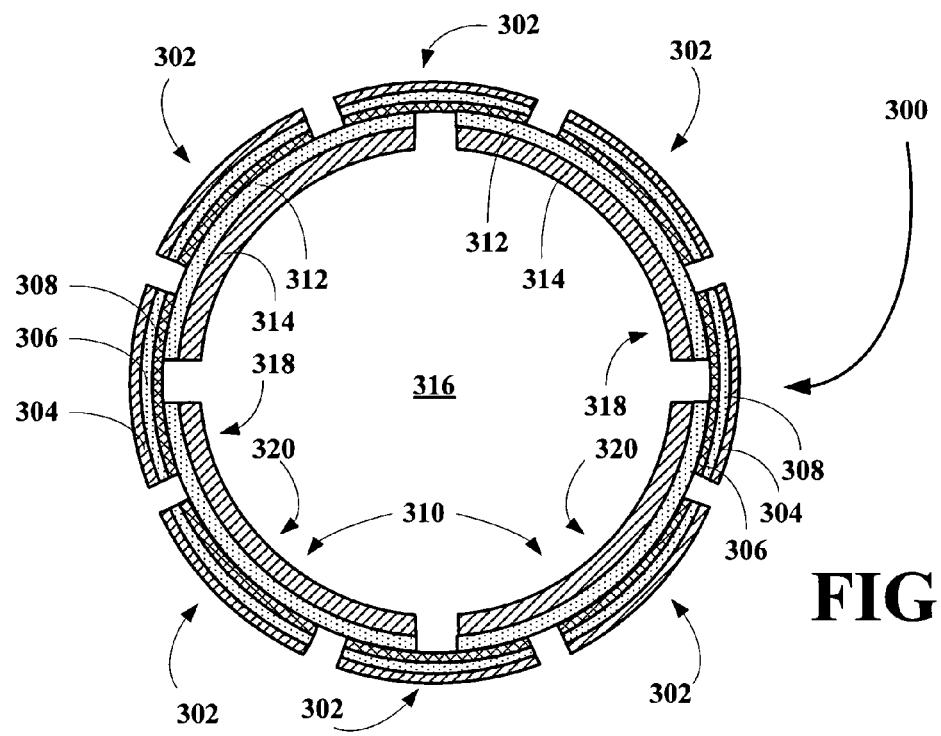
FIGS. 3A & B depict a preferred embodiment of birdcage type MRI coil array of this invention.
Figure 3B:
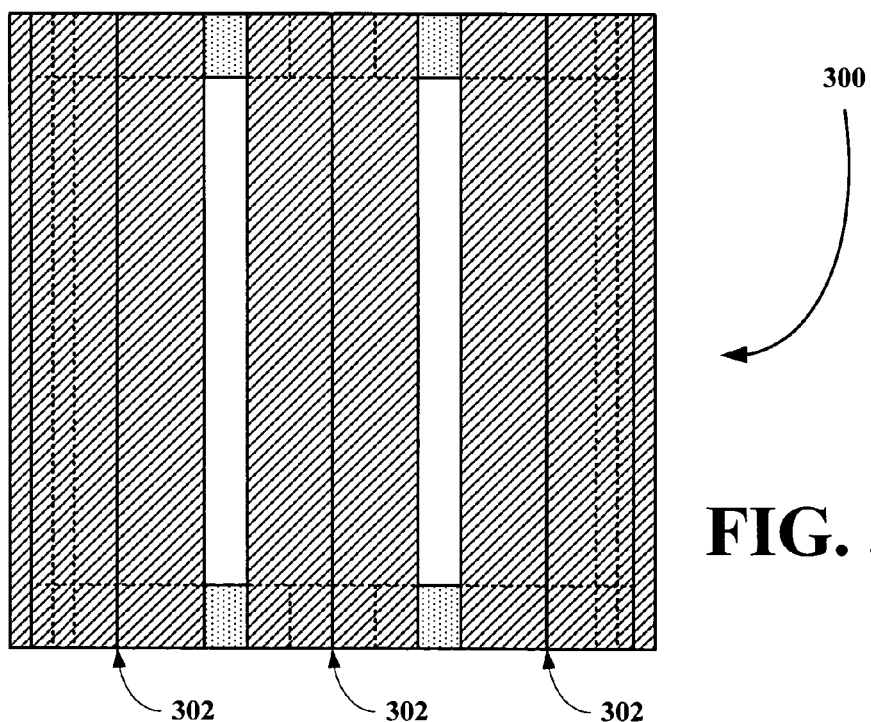
FIGS. 3C & D depict another preferred embodiment of birdcage type MRI coil array of this invention.

Referring now to FIGS. 3A & B, another preferred embodiment of an all superconducting birdcage apparatus, generally 300, is shown to include eight straight members or legs 302, where each straight member 302 comprises an outer rigid dielectric substrate film 304, an inner dielectric film 306 and a superconductor film 308 interposed therebetween. The birdcage 300 also includes four circular members 310, where each curved member 310 comprises a superconducting film 312 deposited on a flexible dielectric substrate 314. As in the birdcage of FIGS. 2A & B, the superconducting film 312 is preferably fabricated as a plurality of substantially flat section; however, as fabrication techniques progress, the superconducting film 312 may eventually be of a fabricated curvilinear form. The legs 302 and the circular members 310 are configured to form a generally cylindrical animal cavity 316. The legs 302 and circular or arcuate members 310 overlap at first and second overlap regions 318 and 320, each overlap region 318 or 320 forms a capacitor interconnecting inductors formed by the superconducting films. This design forms a low-pass birdcage resonator. The flexible dielectric substrates are generally between about 30 and about 50 μm thick and formed of yttrium, strontium, zirconium dielectric or a sapphire dielectric film. The inner dielectric film is generally telfon, other polymers, silica titanate or similar dielectric materials.

Figure 3C:
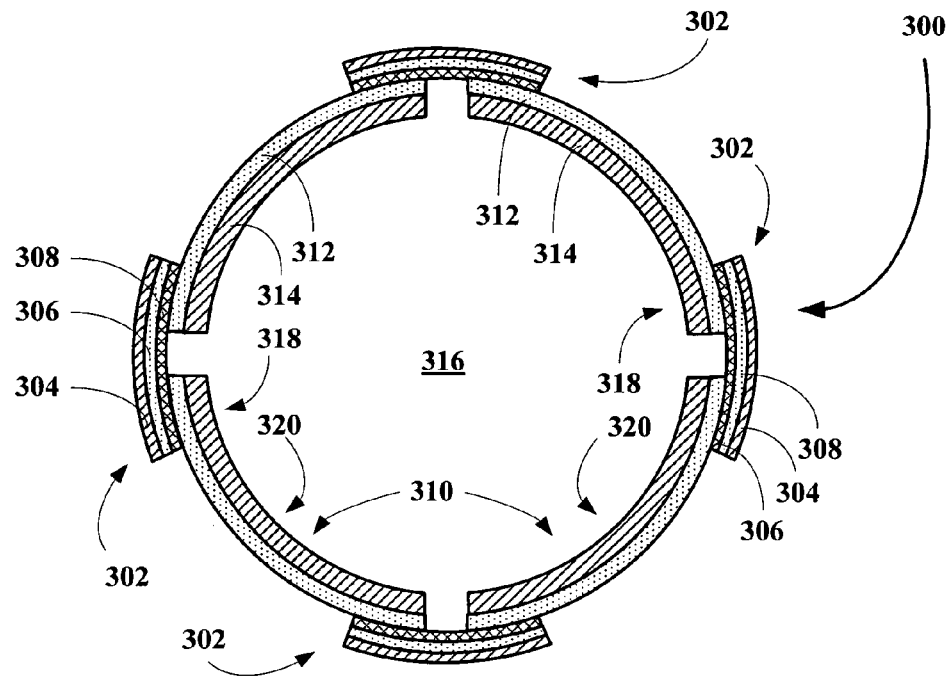
Figure 3D:
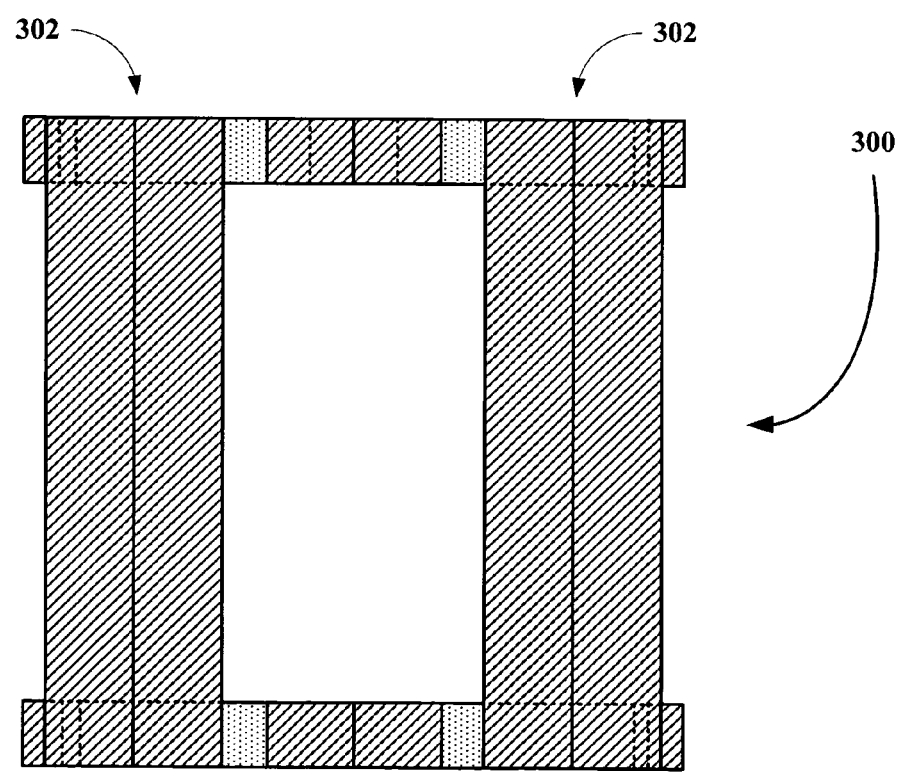

Referring now to FIGS. 3C & D, another preferred embodiment of an all superconducting birdcage apparatus, generally 300, is shown to include four straight members or legs 302, where each straight member 302 comprises an outer rigid dielectric substrate film 304, an inner dielectric film 306 and a superconductor film 308 interposed therebetween. The birdcage 300 also includes four circular or arcuate members 310, where each curved member 310 comprises a superconducting film 312 deposited on a flexible dielectric substrate 314. As in the birdcage of FIGS. 2A & B, the superconducting film 312 is preferably fabricated as a plurality of substantially flat section; however, as fabrication techniques progress, the superconducting film 312 may eventually be of a fabricated curvilinear form. The legs 302 and the circular members 310 are configured to form a generally cylindrical animal cavity 316. The legs 302 and circular or arcuate members 310 overlap at overlap regions 318, each overlap region 318 forms a capacitor interconnecting inductors formed by the superconducting films in the legs. The apparatus 300 also includes four arcuate sections 320 interlaced with the legs 304, where the sections 320 form capacitors interconnecting inductor form by the arcuate members 310. The four legged apparatus forms a band-pass birdcage resonator, where the capacitors are placed not only on the legs, but also on the ring. The four flat strips comprise a YBCO/substrate composite and the four flexible strips comprises a YBCO/buffer-layer/flexible $ZrO_2$ composite to form a four legs band-pass birdcage resonator.

Hybrid Coils

In order to accommodate requirements for usually complicated shapes of optimized MRI coils as well as to allow relatively easy cooling of HTS coils, we have also designed hybrid (HTS/cooper) MRI coils or arrays. Referring now to FIGS. 4A & B, a preferred mixed superconducting-metal coil of this invention, generally 400, is shown to include two copper blocks 402 and two legs 404, where each leg 404 includes a dielectric substrate layer 406 and a superconducting layer 408 deposited thereon. The blocks 402 are positioned at end portions 410 of the legs 404 with the superconducting layer 408 of the legs 404 facing the copper blocks 402. The coil 400 also includes dielectric strips 412 interposed between the copper blocks 402 and end portions 414 the superconducting layer 408 of the legs 404. The coil 400 also includes metal pads 416 formed on end portions 418 of the dielectric layers 406 of the legs 402. The copper blocks 402, dielectric strips 412 and the end portions 414 of the superconducting layers 408 combine to form built-in internal capacitors interconnecting the copper blocks 404 and the superconducting layers 408. The end portions 414 of the superconducting layers 408, the end portions 418 of the dielectric layers 406, and the metal pads 416 form built-in external capacitors.

Referring now to FIGS. 4C & D, another preferred mixed superconducting-metal coil of this invention, generally 400, is shown to include two copper blocks 402 and two legs 404, where each leg 404 includes a dielectric substrate layer 406 and a superconducting layer 408 deposited thereon. The blocks 402 are positioned at end portions 410 of the legs 404 with the dielectric substrate layer 406 of the legs 404 facing the copper blocks 402. The coil 400 also includes dielectric strips 412 formed on end portions 414 the superconducting layer 408 of the legs 404 and metal tabs 416 formed on the dielectric strips 412. The copper blocks 402, end portions 418 of the dielectric layer 406, and the end portions 414 of the superconducting layers 408 combine to form built-in internal capacitors interconnecting the copper blocks 404 and the superconducting layers 408. The end portions 414 of the superconducting layers 408, the dielectric strips 412, and the metal tabs 416 form built-in external capacitors.

The main concept of these mixed or composite coils are the same as in the fully superconducting coils of FIGS. 1A-F; however, two sections of the HTS films are replaced with copper blocks allowing the coils to be directly cooled by a cooling system, i.e., the copper or other metallic blocks can be placed in direct contract with a cooled surface. As with the fully superconducting coils, the mixed or composited coils of FIGS. 4A-D include built in capacitors using two conducting layers separated by a dielectric layer.

Figure 4E:
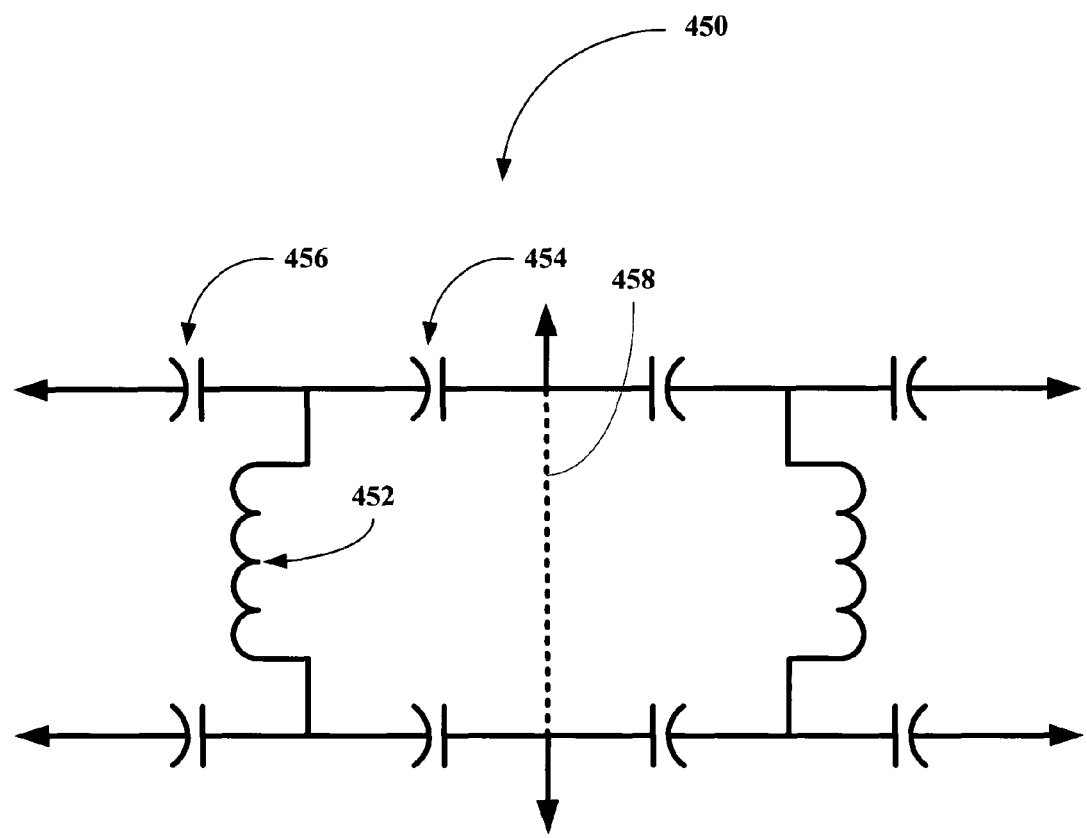
FIG. 4E depicts a schematic diagrams corresponding to the resonators of FIGS. 4A-D.

Referring now to FIG. 4E an equivalent circuit generally 450 is shown that corresponds to the coils of FIGS. 4A-D. The circuit 450 includes inductors 452 interconnected by internal capacitors 454 and capacitively isolated from external electronic components by external capacitors 456. The circuit 450 also includes a virtual ground plane 458.

The hybrid MRI resonators of this invention include two sections of YBCO/substrate and two pieces of copper which are interconnected via the built-in internal capacitors 454. Two of the metal pads 416 are adapted to couple the resonator to a scanner amplifier, while the other two metal pads 416 are adapted to decouple adjacent resonators if the individual coils are used in an array configuration. Two ways of creating capacitors are shown. As shown in FIGS. 4A & B, the built-in internal capacitors 454 comprise the copper block 402/the dielectric strip 412/the superconducting layer 408 such as a YBCO layer. As shown in FIGS. 4C & D, the built-in internal capacitors 454 comprise the copper block 402/the dielectric substrate layer 406/the superconducting layer 408 such as a YBCO layer. The built-in internal capacitors 454 in conjunction with the conductive elements which for the inductors 452 for the coil resonator, while the built-in external capacitors 456 interconnect metal and superconducting films into single loop (resonator). The external capacitors 456 are designed to either connect the resonator to an amplifier or for decoupling array elements.

Birdcage-Type Resonators using Hybrid Coils

Figure 5A:
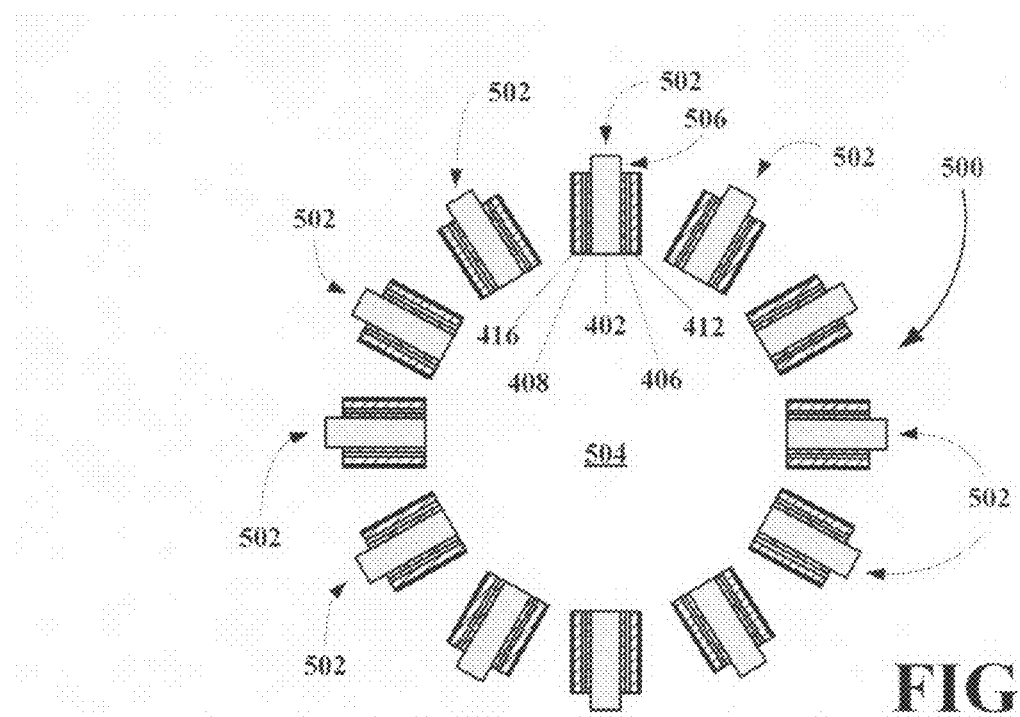
FIGS. 5A & B depict a preferred birdcage-type hybrid coil array resonator of this invention.
Figure 5B:
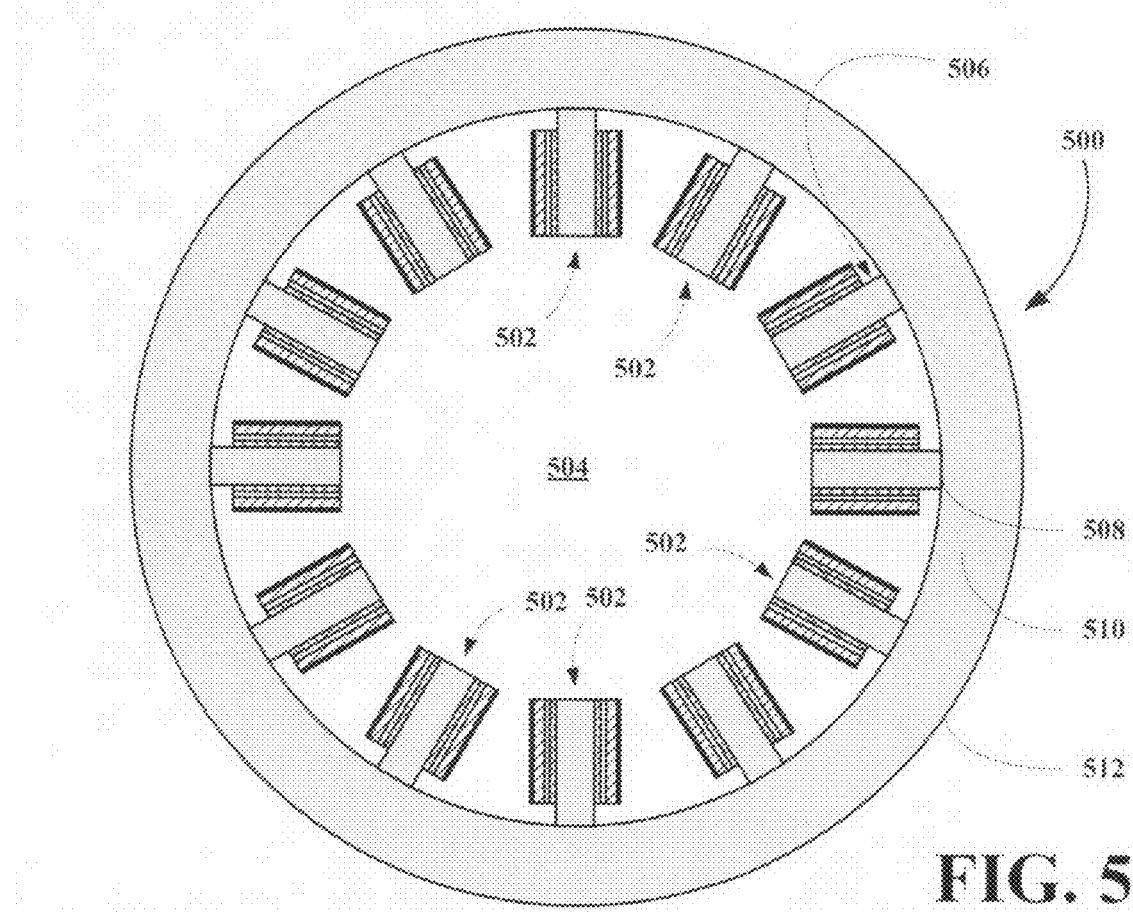
FIGS. 5C-E depict another preferred birdcage-type hybrid coil array resonator of this invention.

Referring now to FIGS. 5A & B, a preferred embodiment of a mixed superconducting-metal birdcage array resonator, generally 500, is shown to include twelve hybrid coils 502 as shown in FIGS. 4A & B arranging in a circular configuration forming a cavity 504. In the coils 502, the copper blocks 402 include a portion 506 that extends out past the coils layers 406, 408, 412, and 416. The portions 506 are designed to directly contact a cold inner surface 508 of a metal ring 510 that would be in contact with a coolant on its outer surface 512. The resonator 500 forms a cylinder having a cavity into which a small animal can be placed and the assembly then placed in an MRI device. The resonator 500 is cooled by bring the outer surface of the metal ring 510 in contact with a coolant, such as liquid nitrogen. The resonator 500 is an example of phased array made out of hybrid (metal/superconductor) resonators of FIGS. 4A-D. The individual coils 502 can be mutually de-coupled, as it is required for phased array use via the built-in capacitors and wires leading from the metal pads from one coil to the next or from a coil to a pre-amplifier or amplifier associated with the MRI device. Although an outer metal ring, preferably a copper ring, is shown in FIG. 5B, the ring can be constructed out of any good heat conductor, metal or non-metal. Preferred non-metal rings can be made out of polycrystalline sapphire or other non-metal thermal conducting materials.

Figure 5C:
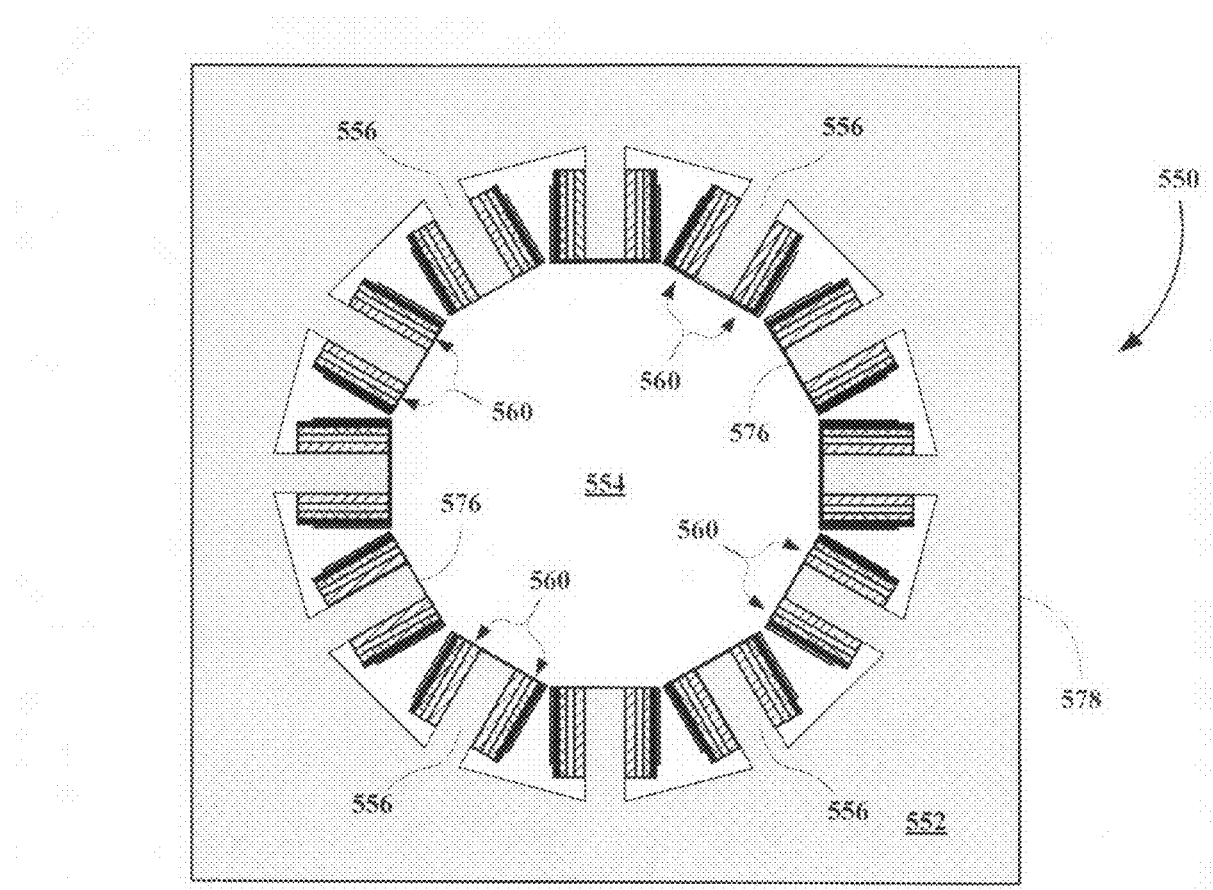
Figure 5D:
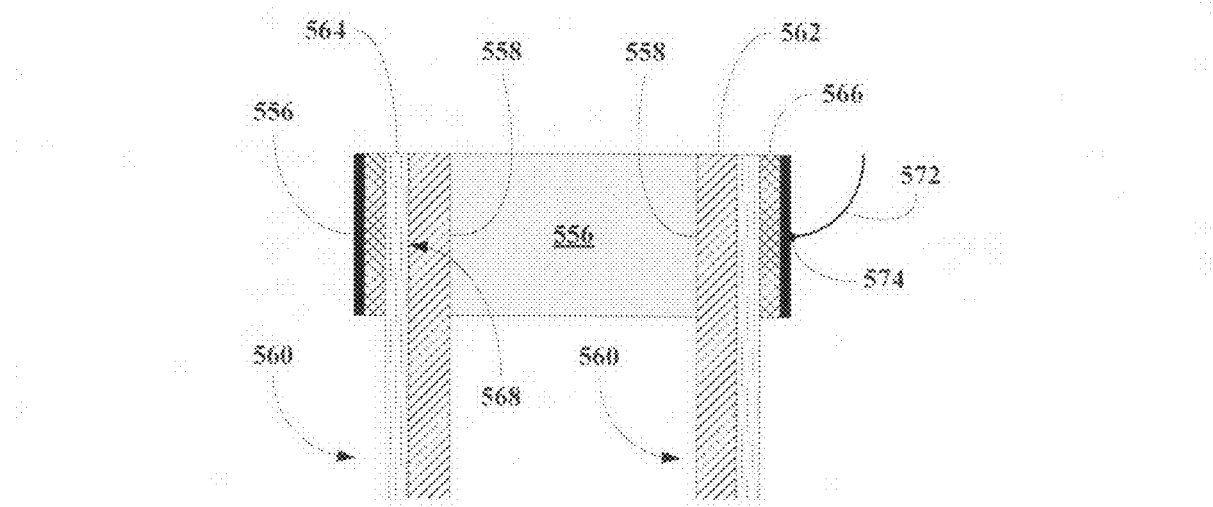

Referring now to FIGS. 5C & D, another preferred embodiment of a mixed superconducting-metal birdcage array resonator, generally 550, is shown to include two thermal conducing members 552 (only one shown), each member 552 including a circular aperture 554 therethrough having twelve equally spaced, circularly configured protrusions 556 extending into the aperture 554. On each lateral side 558 of each protrusion 556 are placed legs 560 extending between the two members 552 to form an elongate resonator where the aperture 554 comprises the small animal cavity. Looking from the protrusions 556 out, each leg 560 includes an inner, rigid dielectric substrate layer 562 in contact with a side 558 of a protrusion 556 and a superconducting layer 564. These two layer 562 and 564 extend between the two member 552. Each leg 560 also includes a dielectric strip 566 formed on or in contact with an end portion 568 of the superconducting layer 564. Each dielectric strip 566 in turn has deposited thereon or is in contact with a metal pad 570. The metal pads 570 can have a wire 572 bonded thereto by a soldier bump 574 so that the individual coils can be formed into an array and/or connected to pre-amplifiers or amplifiers associated with the MRI device. The resonator 550 can also include climps 576 designed to hold the two legs 560 per protrusion against the protrusions 556. The member 552 are designed to directly contact a coolant on their outer surfaces 578. The resonator 550 forms a cylinder having a cavity into which a small animal can be placed and the assembly then placed in an MRI device. The resonator 550 is cooled by bring the outer surfaces 578 of the members 552 in contact with a coolant, such as liquid nitrogen. The resonator 550 is an example of phased array made out of hybrid (metal/superconductor) coils. The individual coils 502 can be mutually de-coupled, as it is required for phased array use via the built-in capacitors and wires leading from the metal pads from one coil to the next or from a coil to a pre-amplifier or amplifier associated with the MRI device. The members 552 are preferably made out of copper, but other metal will work, especially metals having a high thermal and electric conductivities.

Figure 5E:
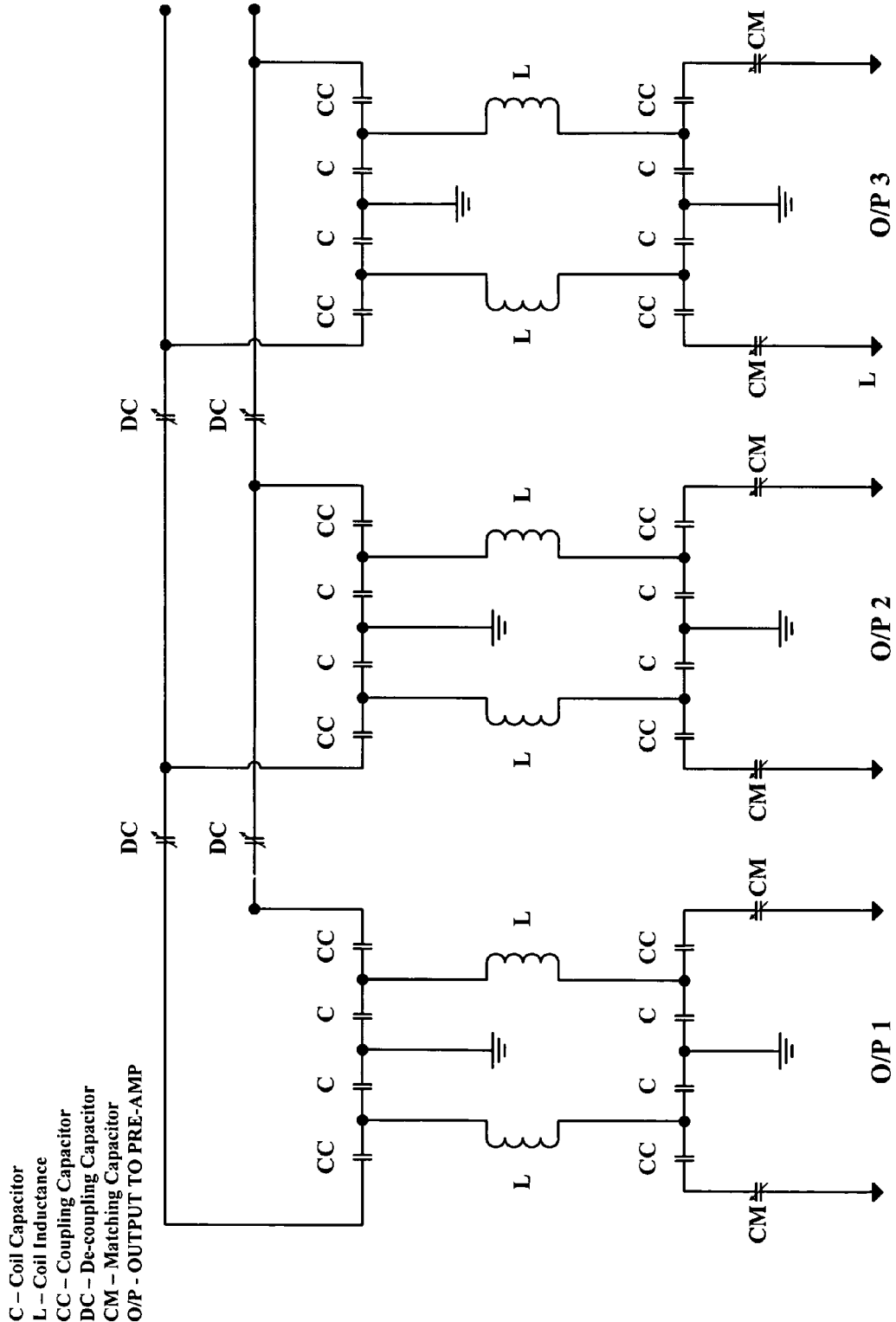

Referring now to FIG. 5E, a schematic corresponding to the hybrid arrays of FIGS. 5A-D is shown to include the coil capacitors C and coil inductors L along with coupling, decoupling, tuning and matching elements CC, DC and CM. The outputs O/P are forwarded to preamps that can be either within the cooled area or external thereto. The coupling, decoupling, tuning and matching elements can be similarly applied to any array of MRI coils of this inventor or to any single MRI coil of this invention.

Figure 6A:
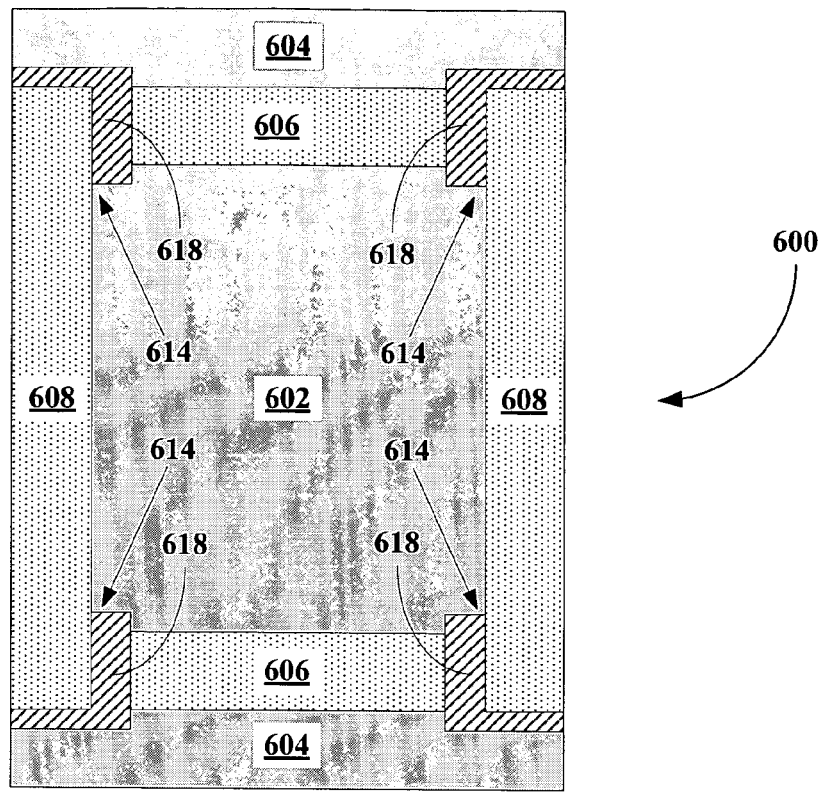
FIGS. 6A & B depict another preferred birdcage-type hybrid coil array resonator of this invention.
Figure 6B:
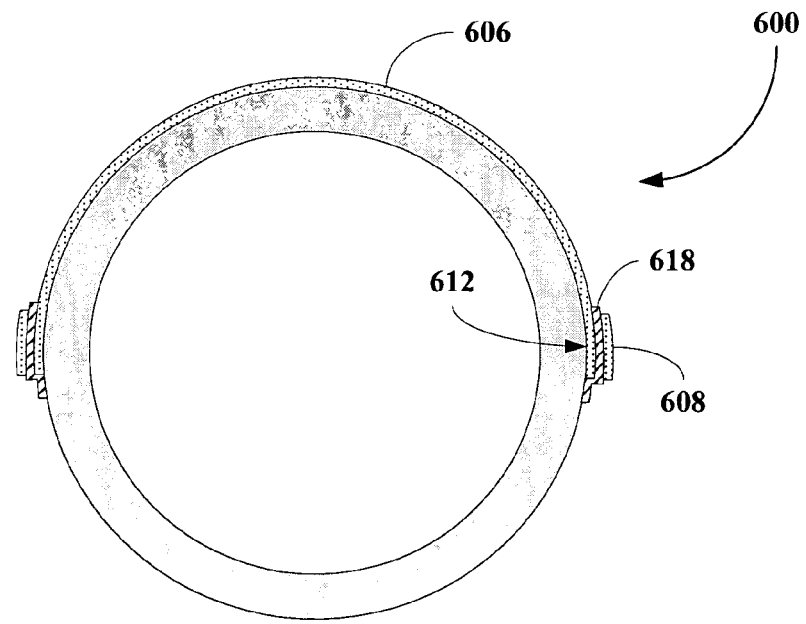

Referring now to FIGS. 6A & B, another preferred embodiment of a mixed superconducting-metal birdcage resonator of this invention, generally 600, is shown to include a metallic tube 602 having formed on an outer surface 604 of the tube 602 two curvilinear superconducting layers 606 and two straight superconducting layers 608. The curvilinear layers 606 are disposed radially across end portions 610 of the tube 602, while the straight layers 608 run axially from end portions 612 of the curvilinear layers 608. At their overlapping regions 614 and 616, a layer 618 of mica or other dielectric material is interposed therebetween. These overlapping regions form built-in capacitors interconnecting inductive elements formed by the non-overlapping 620 of the superconducting layers 606 and 608.

Figure 7A:
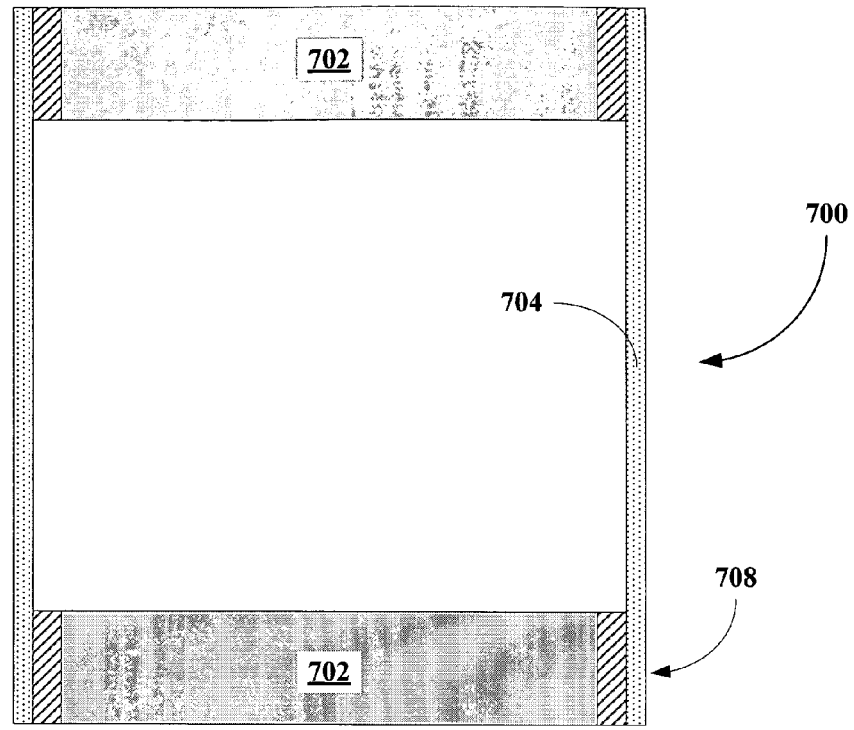
FIGS. 7A & B depict another preferred birdcage-type hybrid coil array resonator of this invention.
Figure 7B:
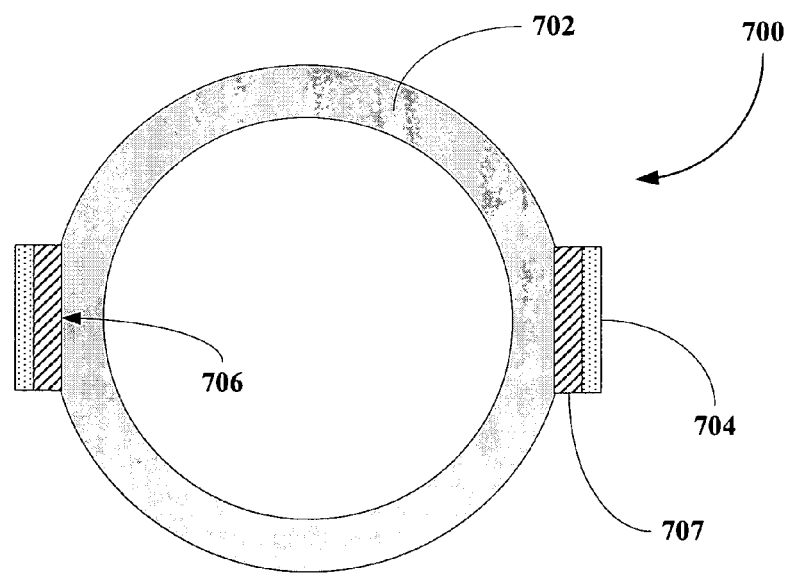

Referring now to FIGS. 7A & B, another preferred embodiment of a mixed superconducting-metal birdcage array resonator, generally 700, is shown to include two metallic rings 702 and two straight superconducting legs 704 connecting the rings 702 at opposite sides of each ring 702 at flattened sections 706 with a dielectric layer 707 interposed between the flattened section 706 of the rings 702 and overlapping portions 708 of the legs 704.

In FIGS. 6A & B and 7A & B, the dielectric layer or mica layer is generally about 20 μm thick. The ring or tube is generally about 10 mm thick and about 2" long and about 2.5" in diameter. The resonators resonate at a frequency of about 200 MHz. Of course, the resonate frequency can be changed by changing the capacitance of the built-in capacitors and the inductance of the inductive regions of the superconducting layer and metallic layers.

Figure 8A:
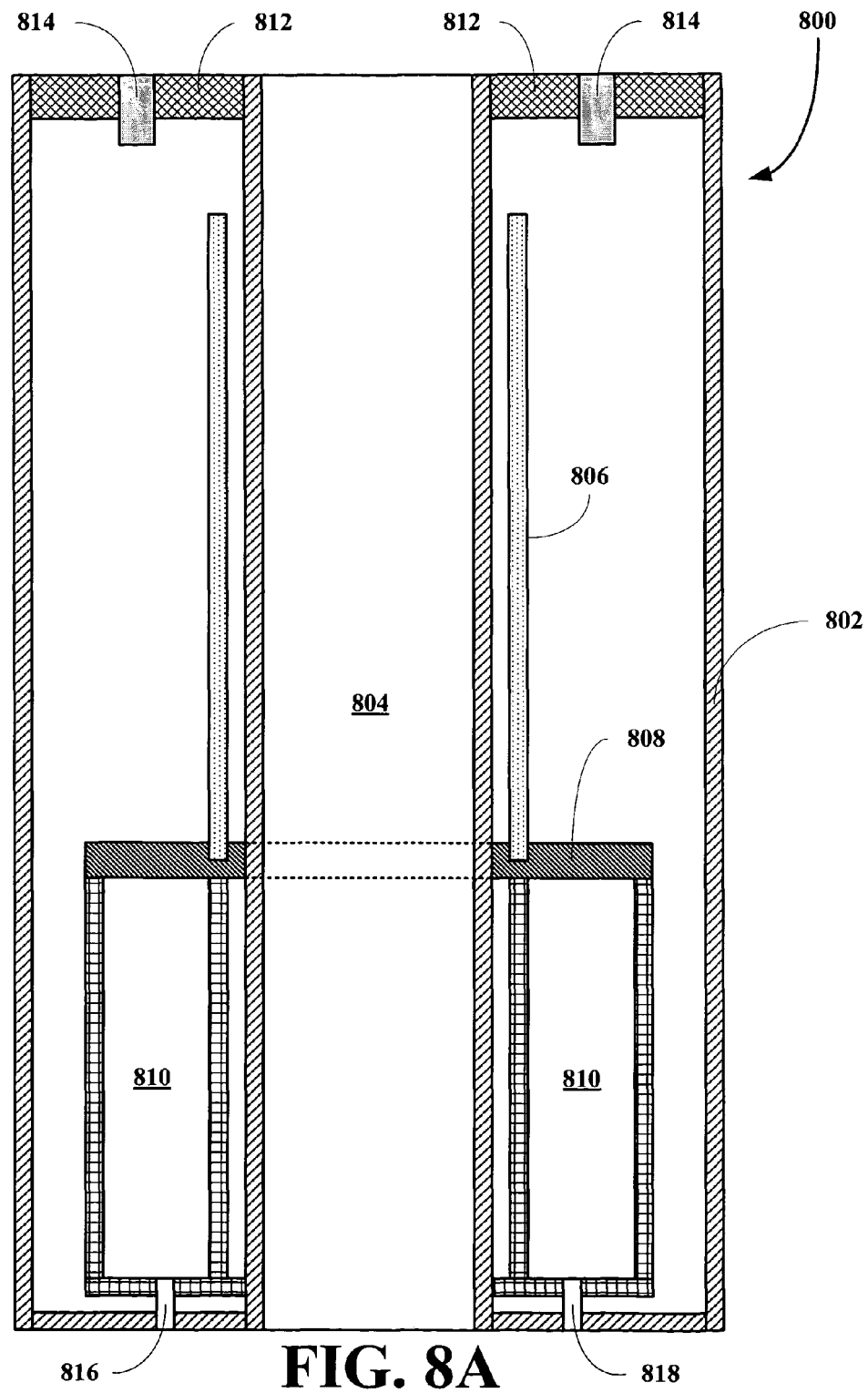
FIGS. 8A & B depict a preferred small animal MRI apparatus of this invention.
Figure 8B:
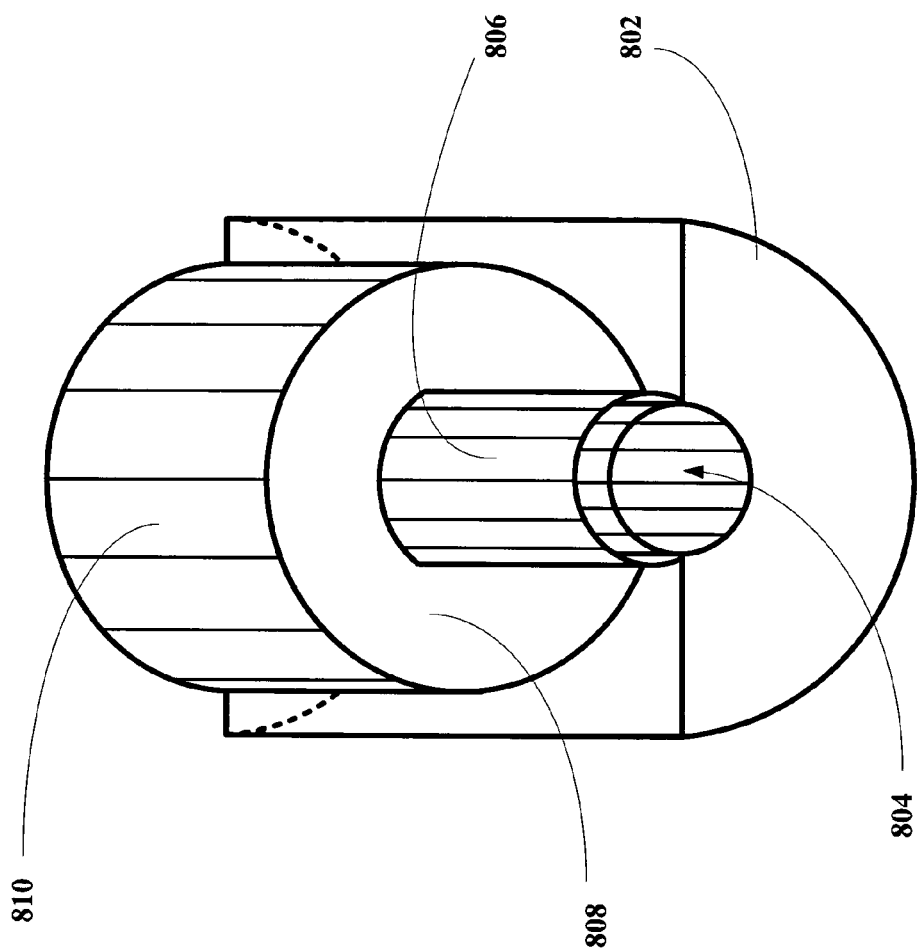

Referring now to FIGS. 8A & B, a preferred small animal MRI resonator apparatus, generally 800, is shown to include a plastic or non-magnetic cryostat housing 802 having a cylindrical aperture 804 therethrough defining a small animal cavity. Surrounding the aperture 804, is a cylindrical MRI resonator 806 of this invention in thermal contact with a thermally conductive plate 808. The plate 808 comprises the outer surface of a liquid nitrogen reservoir 810. The housing 802 also includes a ring sealing member 812 having two electrical feed tube 814 extending therethrough. The housing 802 is capable of being placed under a vacuum. The cryostat 800 includes a vacuum shroud 802, a liquid nitrogen container 810 with one side wall made out of a sapphire plate 808. The container 810 includes a liquid nitrogen inlet 816 and a liquid nitrogen outlet 818. The plate temperature will be uniformly at 77K and will not dependent on level of liquid nitrogen in the container 810. The MRI resonator 806 comprises copper and/or YBCO materials and will be in thermal contact with the plate 808. In this apparatus 800, the aperture 804 can either extend the entire length of the housing or it can stop at the plate 808 so that the small animal is confined within the part of the apparatus 800 surrounded by the resonator 806.

Figure 9:
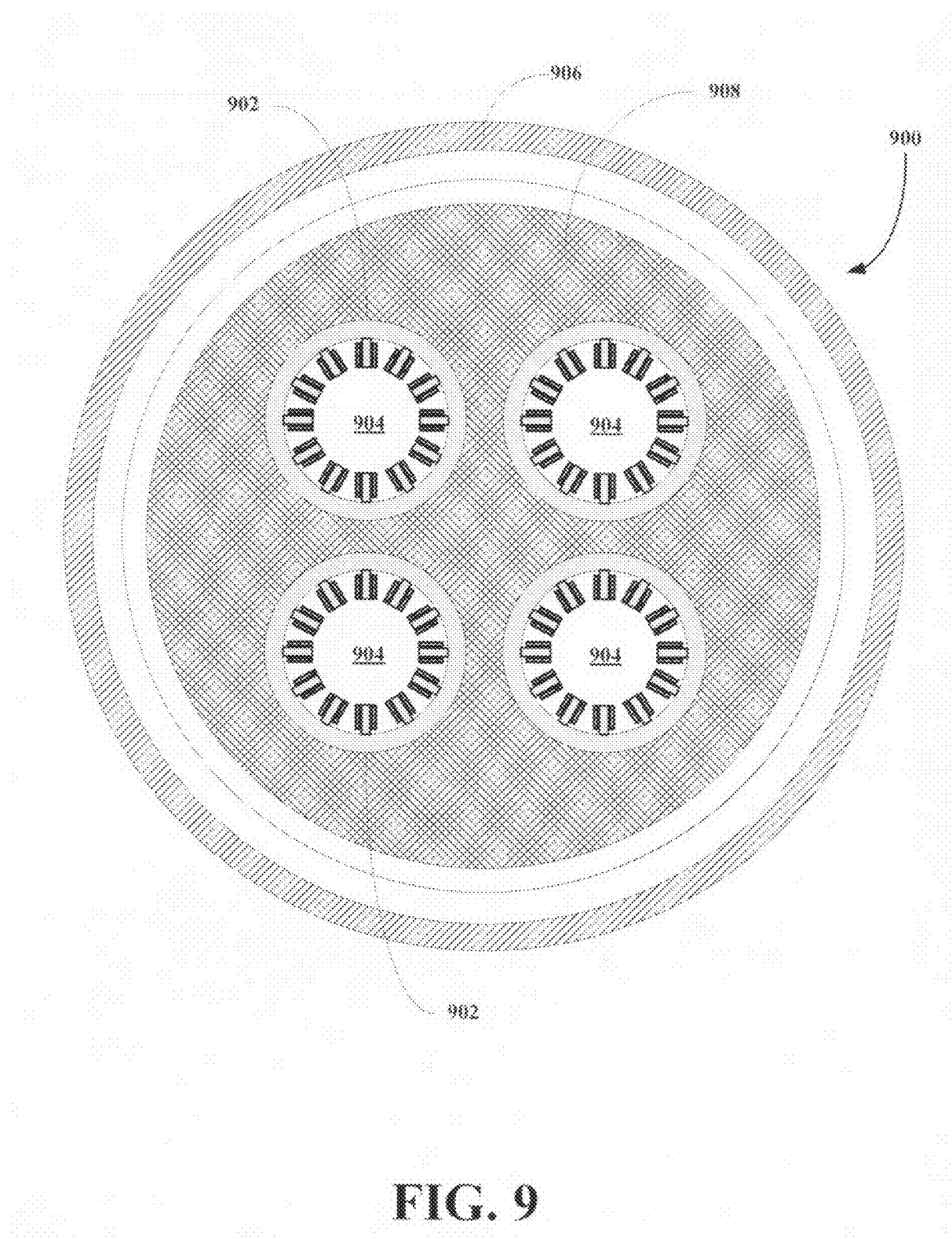
FIG. 9 depicts another preferred small animal MRI apparatus of this invention.

Referring now to FIG. 9, another preferred small animal MRI resonator apparatus, generally 900, is shown to include four hybrid array 902 of FIGS. 5A-D each array 902 defining having a small animal cavity 904. The four arrays 902 are housed in a vacuum shroud or housing 906 and are in thermal contact with a plate 908 which forms an outer surface of a liquid nitrogen reservoir (not shown). The housing 906 includes a top (not shown) that seals the housing 906 so that the interior can be evacuated, where the top includes electrical wiring feed throughs as described previously. The apparatus 900 can accommodate up to four animals and MRI data can be acquired on each simultaneously or separately.

Figure 10:
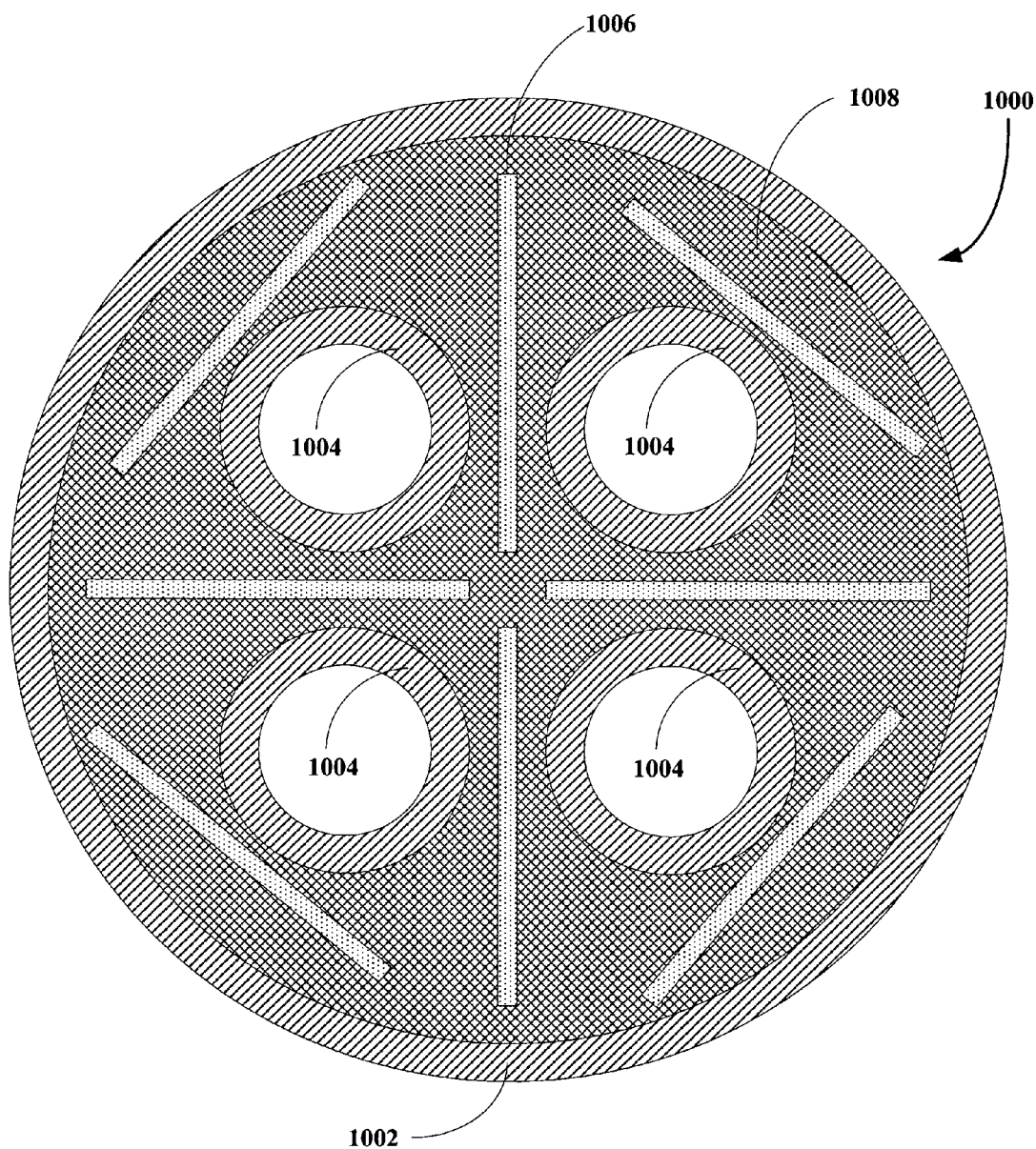
FIG. 10 depicts another preferred small animal MRI apparatus of this invention.
Figure 11A:
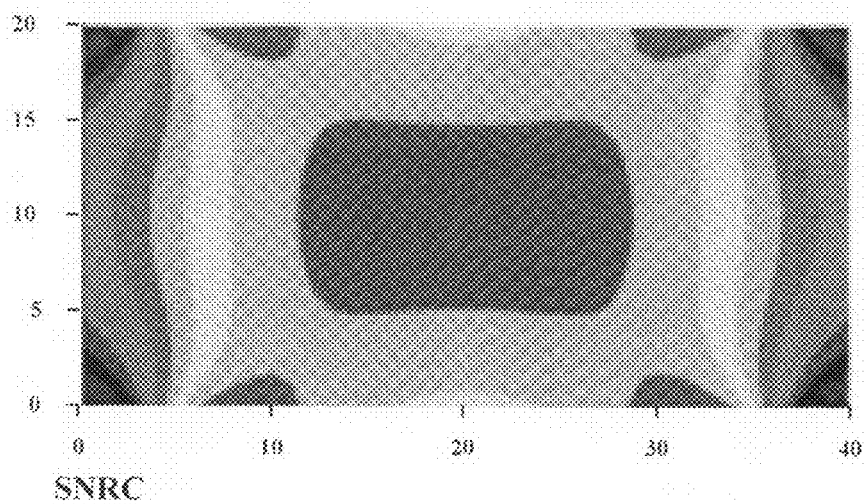
FIGS. 11A-D depict physical characteristics of the coils resonators of this invention.
Figure 11B:
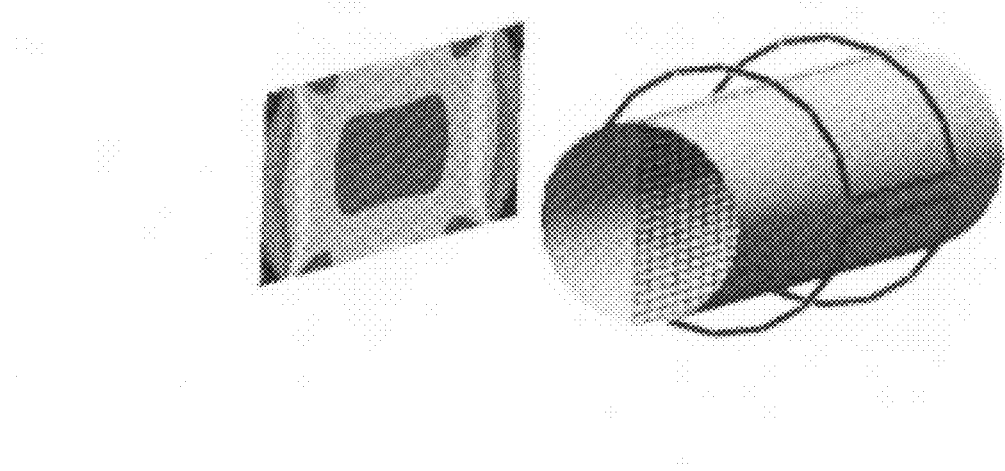
Figure 11C:
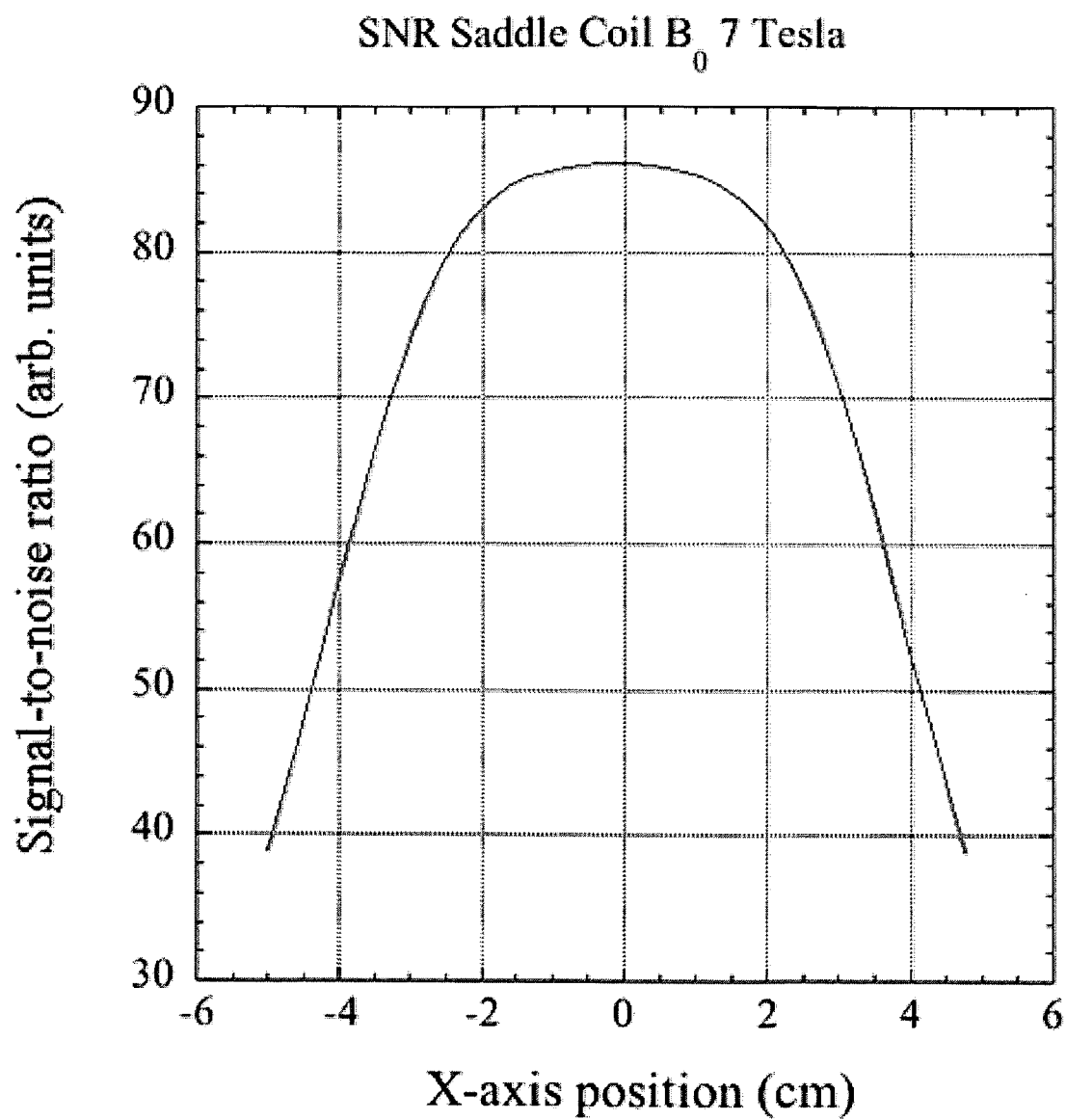
Figure 11D:
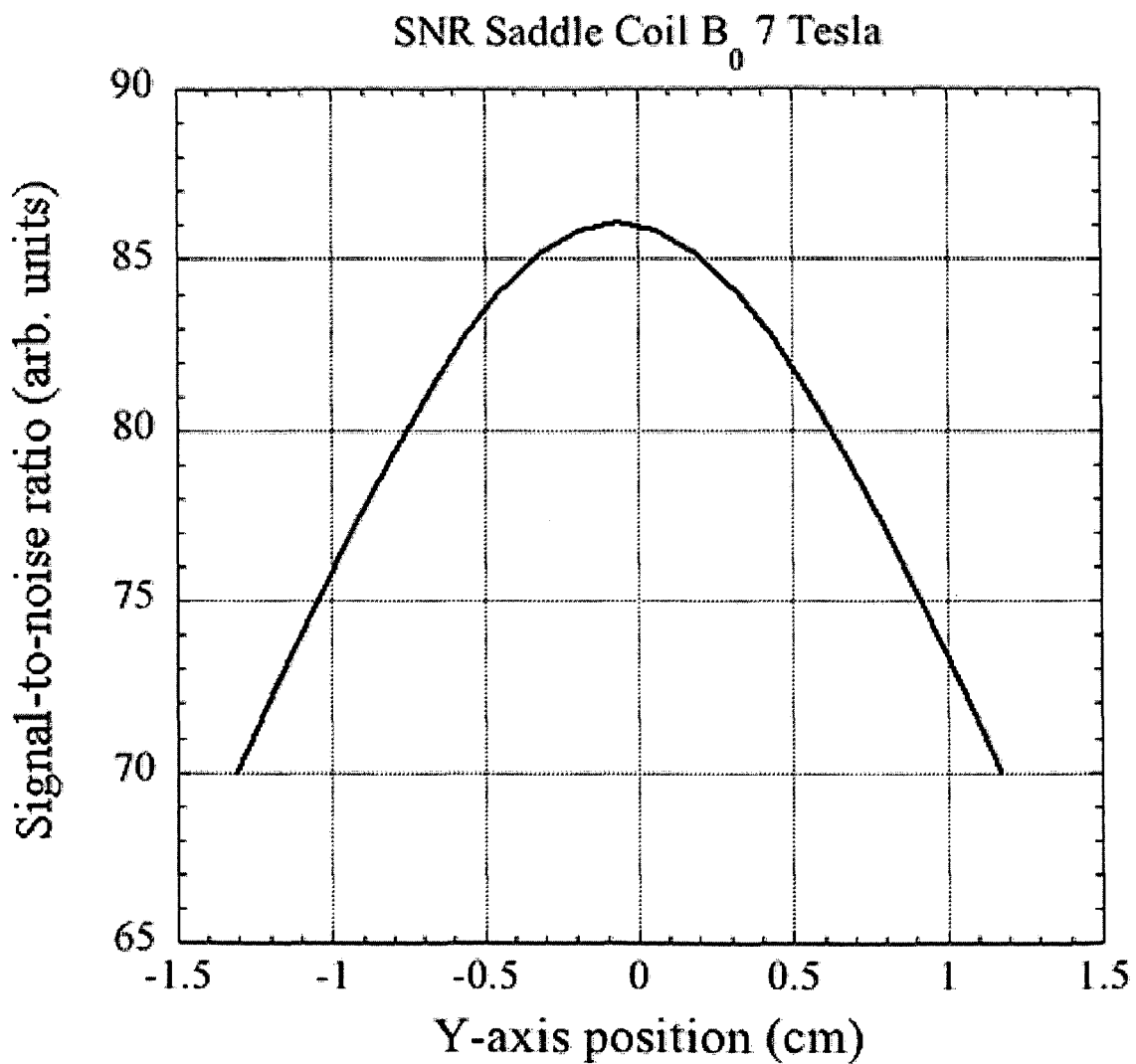

Referring now to FIG. 10, another preferred small animal MRI resonator apparatus, generally 1000, is shown to include a non-conductive housing 1002 having four small animal tubes 1004. The housing 1002 also includes eight flat MRI coil or MRI array apparatuses 1006, where each tube 1004 is adjacent three MRI apparatuses 1006. The eight MRI apparatuses 1006 are in thermal contact with a thermally conducting plate 1008 which forms an outer surface of a liquid nitrogen reservoir (not shown). The housing 1002 includes a top (not shown) that seals the housing 1002 so that the interior can be evacuated, where the top includes electrical wiring feed throughs as described previously. The apparatus 1000 can accommodate up to four animals and MRI data can be acquired on each simultaneously or separately. The rigid flat MRI apparatuses 1006 comprise preferably HTS coils and by sharing coils, a reduced number of HTS coils are needed for such systems. Each tube in which a mouse is placed is surrounded by array of superconducting coils.

Referring now to FIGS. 11A-D, illustrate the physical characteristic so MRI coils and arrays made thereform. Looking at FIGS. 11A & B, the magnetic fields generated by the coils of this invention are shown. Looking at FIGS. 11 C & D, the SNR for these coils is shown.

Figure 12A:
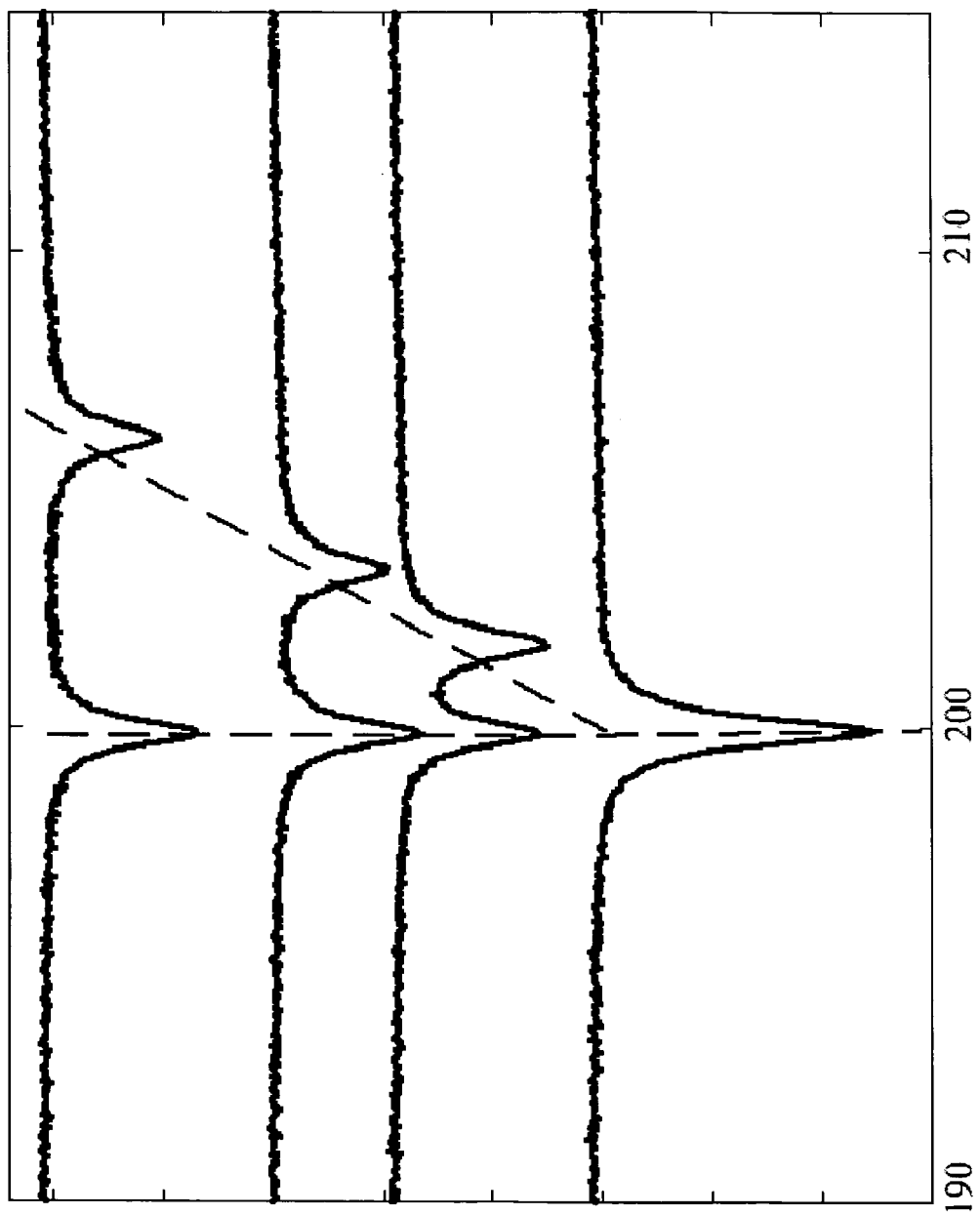
FIG. 12A depicts performance of a circuit having the tuning and matching circuitry within the small animal device and cooled simultaneously producing improved SNR.
Figure 12B:
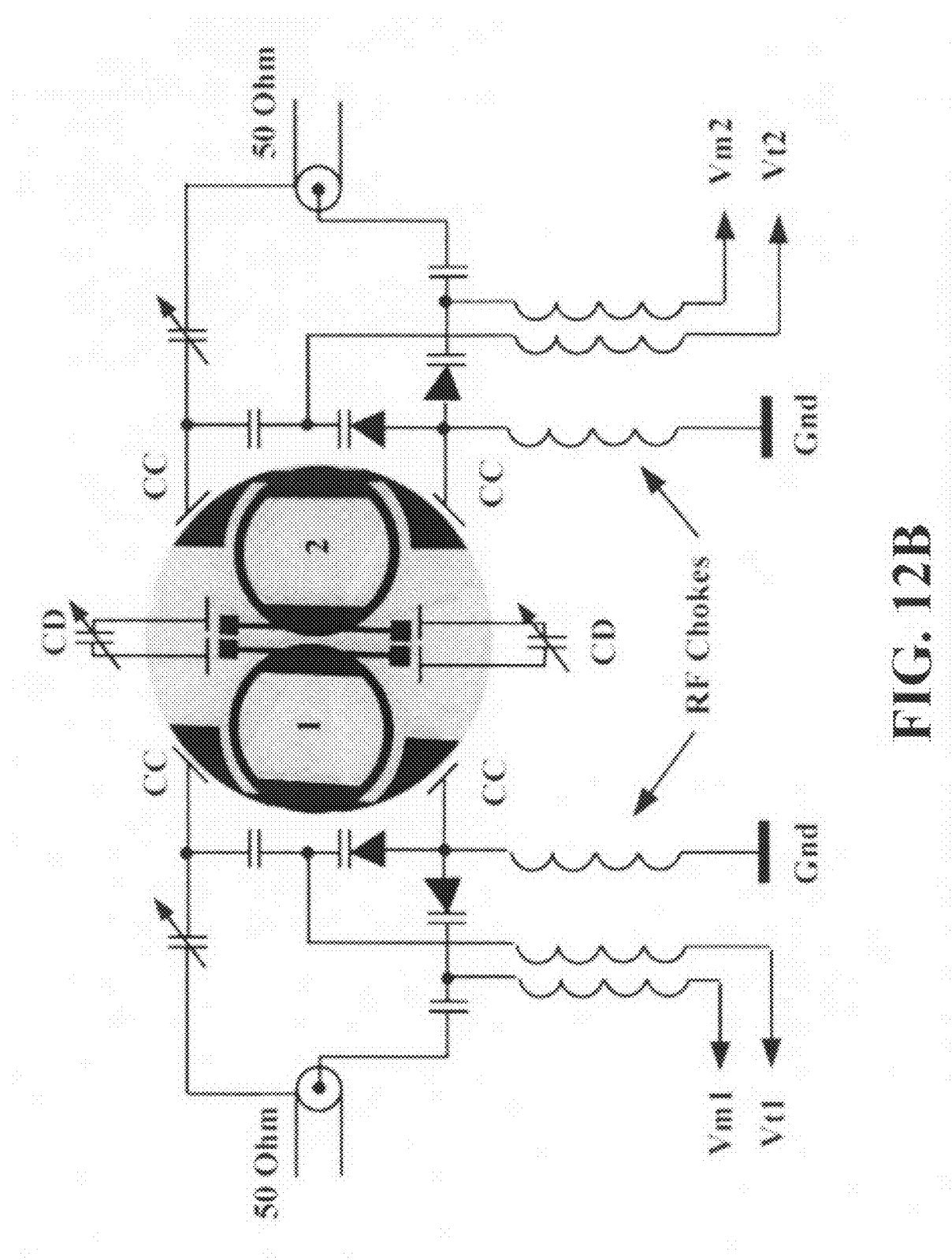
FIG. 12B depicts the tuning and matching circuitry for use with the coils and arrays of this invention.

The inventors have found that when tuning and matching circuitry is placed next to the superconducting array and cooled together with the array, the entire system has superior performance. In fact, cooling the two circuit elements together is preferred because it allow us to take advantage of the high Q of the arrays of this invention. The inventors have also found that by integrating a pre-amplifier into this circuitry so that the pre-amp is cooled as well results in further noise reduction. Looking at FIGS. 12A & B, the performance of a circuit having the tuning and matching circuitry within the small animal device and cooled simultaneously produces improved SNR. FIG. 12B also shows the tuning and matching circuitry for a coil similar to the coils of this invention disclosed in PCT application Ser. No. PCT/US03/33933, filed 24 Oct. 2003, published as WO04038431, incorporated herein by reference. The tuning and matching circuitry shown in FIG. 12B can be use with the coils and arrays of this invention as well. Co-cooling the matching and tuning circuitry, applies, in general, not only to thin film arrays, but also to saddle, birdcage and hybrid coils/arrays. In fact, we have installed such low temperature circuit in our cryostat, which designing idea is presented in the provisional.

All references cited herein are incorporated by reference. While this invention has been described fully and completely, it should be understood that, within the scope of the appended claims, the invention could be practiced otherwise than specifically described. Although the invention has been disclosed with reference to its preferred embodiments, from reading this description those of skill in the art can appreciate changes and modifications that may be made which do not depart from the scope and spirit of the invention as described above and claimed hereafter.

We claim:

1. An MRI apparatus capable of imaging small nonhuman animals comprising:
   a vacuum housing including
      at least one aperture, where each aperture is configured to receive a small nonhuman animal,
   a coolant assembly including
      a coolant inlet,
      a coolant outlet and
      a cold plate, where a coolant is configured to cool the cold plate,
   at least one resonator,
      each resonator comprising:
         two closed saddle-shaped coils in thermal contact with the cold plate, each saddle-shaped coil comprising:
            four members, each member including a superconducting layer, where the members are arranged in order to form four overlapping regions,
            each overlapping region comprises:
               a capacitor formed from overlapping portions of the superconducting layers of two of the members and an overlapping region dielectric layer interposed therebetween,
            where two of the members are straight and two of the members are curvilinear in order to form the closed saddle-shaped coils, and
      where a resonator surrounds each at least one aperture.

2. The apparatus of claim 1, wherein each member further comprises:
   a substrate dielectric layer upon which the superconducting layer was formed, where the dielectric layer of the straight members comprise
   a rigid dielectric material and
      the dielectric layer of the curvilinear members comprise a flexible dielectric material.

3. The apparatus of claim 1, wherein the superconducting layer of the curvilinear members comprise
   a plurality of substantially flat superconducting segments.

4. The apparatus of claim 3, wherein the overlapping regions of the superconducting layer of the curvilinear member comprise
   one of the substantially flat superconducting segments.

5. The apparatus of claim 1, wherein the overlapping region dielectric layers comprise
   separate dielectric layers distinct from the substrate dielectric layers.

6. The apparatus of claim 5, wherein the substrate and the overlapping region dielectric layers are composed of the same or different dielectric material.

7. The apparatus of claim 1, wherein the overlapping region dielectric layers comprise
portions of the substrate dielectric layers of the members.

8. The apparatus of claim 1, wherein each coil apparatus includes:
a metal layer formed on an exposed portion of a dielectric layer or an external dielectric layer formed on an exposed portion of a superconducting layer with a metal layer formed on the outer surface of the external dielectric layer, where the metal layer forms a coupling or decoupling capacitive element with a corresponding portion of the superconducting layer.

9. The apparatus of claim 8, each coil apparatus further includes:
a wire bonded to the metal layer, where the wire links a plurality of the apparatuses together to form an array or to connect the apparatus to a pre-amplifier.

10. The apparatus of claim 1, further comprising:
a plurality of separated spaced apart apertures, each configured to receive a small nonhuman animal allowing the MRI apparatus to simultaneously receive and image a plurality of animals with MRI.

11. An MRI apparatus capable of simultaneously imaging at least two small nonhuman animals comprising:
a vacuum housing including
at least two single-sided, non-collinear apertures, each aperture configured to receive a small nonhuman animal allowing the MRI apparatus to simultaneously receive a plurality of small nonhuman animals,
a coolant assembly including
a coolant inlet,
a coolant outlet and
a cold plate, where a coolant is configured to cool the cold plate,
at least two resonators comprising:
a plurality of closed saddle-shaped coils in thermal contact with the cold plate and arranged in order to form a cylindrical structure,
where a resonator surrounds each aperture, and where the MRI apparatus is capable of simultaneously imaging a small nonhuman animal placed in each of the at least two single-sided, non-collinear apertures with MRI.

12. The apparatus of claim 11, wherein the at least two resonators also comprise: two closed saddle-shaped coils.

13. The apparatus of claim 12, wherein each closed saddle-shaped coil comprises:
four members, each member including
a superconducting layer, where the members are arranged in order to form four overlapping regions, where each overlapping region comprises
a capacitor formed from overlapping portions of the superconducting layers of two of the members and an overlapping region dielectric layer interposed therebetween,
where two of the members are straight and two of the members are curvilinear in order to form the closed saddle-shaped coils.

14. The apparatus of claim 13, wherein each member further comprises:
a substrate dielectric layer upon which the superconducting layer was formed,
where the dielectric layer of the straight members comprise
a rigid dielectric material and
the dielectric layer of the curvilinear members comprise
a flexible dielectric material.

15. The apparatus of claim 13, wherein the superconducting layer of the curvilinear members comprise
a plurality of substantially flat superconducting segments.

16. The apparatus of claim 15, wherein the overlapping regions of the superconducting layer of the curvilinear member comprise
one of the substantially flat superconducting segments.

17. The apparatus of claim 13, wherein the overlapping region dielectric layers comprise
separate dielectric layers distinct from the substrate dielectric layers.

18. The apparatus of claim 17, wherein the substrate and the overlapping region dielectric layers are composed of the same or different dielectric material.

19. The apparatus of claim 13, wherein the overlapping region dielectric layers comprise
portions of the substrate dielectric layers of the members.

20. The apparatus of claim 13, wherein each coil apparatus includes:
a metal layer formed on an exposed portion of a dielectric layer or an external dielectric layer formed on an exposed portion of a superconducting layer with a metal layer formed on the outer surface of the external dielectric layer, where the metal layer forms a coupling or decoupling capacitive element with a corresponding portion of the superconducting layer.

21. The apparatus of claim 20, each coil apparatus further includes: a wire bonded to the metal layer, where the wire links a plurality of the apparatuses together in order to form an array or in order to connect the apparatus to a pre-amplifier.

22. An MRI apparatus capable of simultaneously imaging at least two small nonhuman animals comprising:
a vacuum housing including a plurality of separated spaced apart apertures, each aperture configured to receive an animal allowing the apparatus to simultaneously receive a plurality of small nonhuman animals,
a coolant assembly including a coolant inlet, a coolant outlet and a cold plate, where a coolant is configured to cool the cold plate,
at least two resonators comprising:
a plurality of closed saddle-shaped coils in thermal contact with the cold plate and arranged in order to form a cylindrical structure,
where a resonator surrounds each aperture, and where the MRI apparatus is capable of simultaneously imaging a small nonhuman animal placed in each of the plurality of separated spaced apart apertures with MRI.

23. The apparatus of claim 22, wherein the at least two resonators also comprise:
two closed saddle-shaped coils.

24. apparatus of claim 22, wherein each closed saddle-shaped coil comprises:
four members, each member including a superconducting layer, where the members are arranged in order to form four overlapping regions,
where each overlapping region comprises
a capacitor formed from overlapping portions of the superconducting layers of two of the members and an overlapping region dielectric layer interposed therebetween,
where two of the members are straight and two of the members are curvilinear in order to form the closed saddle-shaped coils.

25. The apparatus of claim 24, wherein each member further comprises:
a substrate dielectric layer upon which the superconducting layer was formed, where the dielectric layer of the straight members comprise
a rigid dielectric material and the dielectric layer of the curvilinear members comprise
a flexible dielectric material.

26. The apparatus of claim 24, wherein the superconducting layer of the curvilinear members comprise
a plurality of substantially flat superconducting segments.

27. The apparatus of claim 26, wherein the overlapping regions of the superconducting layer of the curvilinear member comprise
one of the substantially flat superconducting segments.

28. The apparatus of claim 24, wherein the overlapping region dielectric layers comprise
separate dielectric layers distinct from the substrate dielectric layers.

29. The apparatus of claim 28, wherein the substrate and the overlapping region dielectric layers are composed of the same or different dielectric material.

30. The apparatus of claim 24, wherein the overlapping region dielectric layers comprise
portions of the substrate dielectric layers of the members.

31. The apparatus of claim 24, wherein each coil apparatus includes:
a metal layer formed on an exposed portion of a dielectric layer or an external dielectric layer formed on an exposed portion of a superconducting layer with a metal layer formed on the outer surface of the external dielectric layer, where the metal layer forms a coupling or decoupling capacitive element with a corresponding portion of the superconducting layer.

32. The apparatus of claim 31, each coil apparatus further includes:
a wire bonded to the metal layer, where the wire links a plurality of the apparatuses together in order to form an array or in order to connect the apparatus to a pre-amplifier.

* * * * *